US012701950B2

(12) United States Patent
Lee et al.

(10) Patent No.: US 12,701,950 B2
(45) Date of Patent: Aug. 4, 2026

(54) APPARATUS FOR FABRICATING DISPLAY PANEL AND FABRICATING METHOD THEREOF

(71) Applicant: Samsung Display Co., Ltd., Yongin-si (KR)

(72) Inventors: Tae Hee Lee, Yongin-si (KR); Kyung Ho Kim, Yongin-si (KR); Young Seok Seo, Yongin-si (KR); Joo Woan Cho, Yongin-si (KR); Byeong Hwa Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 197 days.

(21) Appl. No.: 18/469,234

(22) Filed: Sep. 18, 2023

(65) Prior Publication Data

US 2024/0120214 A1 Apr. 11, 2024

(30) Foreign Application Priority Data

Oct. 11, 2022 (KR) ........................ 10-2022-0130067
Nov. 22, 2022 (KR) ........................ 10-2022-0156937

(51) Int. Cl.
*B29C 65/00* (2006.01)
*H10P 72/00* (2026.01)
*H10W 90/00* (2026.01)

(52) U.S. Cl.
CPC ...... *H10P 72/0428* (2026.01); *H10P 72/0604* (2026.01); *H10W 90/00* (2026.01); *B29C 65/00* (2013.01)

(58) Field of Classification Search
CPC .......................... H01L 21/67092; B29C 65/00
See application file for complete search history.

(56) References Cited

U.S. PATENT DOCUMENTS

| | | | | |
|---|---|---|---|---|
| 8,333,860 | B1 * | 12/2012 | Bibl | .................... H01L 21/6833 |
| | | | | 156/273.1 |
| 10,181,507 | B2 | 1/2019 | Bower et al. | |
| 10,269,781 | B1 * | 4/2019 | Brodoceanu | ............ G03F 7/162 |
| 10,573,544 | B1 * | 2/2020 | Radauscher | ............ H01L 22/20 |
| 10,748,793 | B1 * | 8/2020 | Pearson | .............. H10H 20/857 |

(Continued)

FOREIGN PATENT DOCUMENTS

| | | |
|---|---|---|
| JP | 2009-289959 A | 12/2009 |
| KR | 10-1177292 B1 | 8/2012 |
| KR | 2021-0052774 A | 5/2021 |

*Primary Examiner* — Philip C Tucker
*Assistant Examiner* — Nickolas R Harm
(74) *Attorney, Agent, or Firm* — Womble Bond Dickinson (US) LLP

(57) ABSTRACT

An apparatus for fabricating a display panel, the apparatus including: a loading module configured to accommodate a large-area fabricating substrate, the loading module being configured to adjust an inclination of the large-area fabricating substrate from a rear surface of the large-area fabricating substrate and to press the large-area fabricating substrate; and an element transfer module configured to transfer a plurality of light emitting elements or an integrated circuit onto the large-area fabricating substrate and configured to bond and press a wafer on which the plurality of light emitting elements or the at least one integrated circuit is located onto the large-area fabricating substrate.

15 Claims, 23 Drawing Sheets

(56) References Cited

U.S. PATENT DOCUMENTS

| 11,062,936 | B1 * | 7/2021 | Moore | ............. | H01L 21/68764 |
| 11,260,646 | B2 * | 3/2022 | Bennett | ................ | B32B 43/006 |
| 2006/0055864 | A1 * | 3/2006 | Matsumura | ........... | H10F 39/802 |
| | | | | | 257/E27.111 |
| 2019/0308332 | A1 * | 10/2019 | Ahn | .................... | B25J 15/0691 |
| 2020/0215809 | A1 * | 7/2020 | Miyagoshi | ........ | H01L 21/67092 |

* cited by examiner

DBn

DBn

FIG. 24

APPARATUS FOR FABRICATING DISPLAY PANEL AND FABRICATING METHOD THEREOF

CROSS-REFERENCE TO RELATED APPLICATIONS

This application claims priority to and the benefit of Korean Patent Application No. 10-2022-0130067, filed on Oct. 11, 2022, and Korean Patent Application No. 10-2022-0156937, filed on Nov. 22, 2022, in the Korean Intellectual Property Office, the entire contents of all of which are incorporated by reference herein.

BACKGROUND

1. Field

Aspects of embodiments of the present disclosure relate to an apparatus for fabricating a display panel and a fabricating method thereof.

2. Description of the Related Art

The importance of display devices has steadily increased with the development of multimedia technology. In response thereto, various types of display devices such as an organic light emitting diode (OLED) display, a liquid crystal display (LCD) and the like have been used.

A display device is a device for displaying an image, and includes a display panel, such as a light emitting display panel or a liquid crystal display panel. Among them, the light emitting display panel may include a light emitting diode (LED), and the light emitting diode includes an organic light emitting diode (OLED) using an organic material as a fluorescent material or an inorganic light emitting diode using an inorganic material as a fluorescent material.

In fabricating a display panel using an inorganic light emitting diode as a light emitting element, fabricating apparatuses for accurately arranging and transferring light emitting diodes such as micro LEDs onto a substrate of the display panel are required.

SUMMARY

Aspects and features of embodiments of the present disclosure provide an apparatus for fabricating a display panel, which is capable of substantially precisely and accurately transferring light emitting diodes, and a fabricating method thereof.

Aspects and features of embodiments of the present disclosure also provide an apparatus for fabricating a display panel, which is capable of adjusting the inclination of a display substrate from the rear surface of the display substrate by a loading module in response to the inclination of a pressing header for transferring light emitting diodes onto the display substrate, and a fabricating method thereof.

However, aspects and features of embodiments of the present disclosure are not restricted to those set forth herein. The above and other aspects of the present disclosure will become more apparent to one of ordinary skill in the art to which the present disclosure pertains by referencing the detailed description of the present disclosure given below.

According to one or more embodiments of the present disclosure, an apparatus for fabricating a display panel includes: a loading module configured to accommodate a large-area fabricating substrate, the loading module being configured to adjust an inclination of the large-area fabricating substrate from a rear surface of the large-area fabricating substrate and to press the large-area fabricating substrate; and an element transfer module configured to transfer a plurality of light emitting elements or an integrated circuit onto the large-area fabricating substrate and configured to bond and press a wafer on which the plurality of light emitting elements or the at least one integrated circuit is located onto the large-area fabricating substrate.

In one or more embodiments, the element transfer module includes: a transfer member including a pressing header fixed to a fixing part of the transfer member in a pressing direction; a transfer driving member configured to move the transfer member and the pressing header in the pressing direction or a detaching direction through a fixing frame of the transfer member; a pressure sensing module between the pressing header and the transfer member and configured to generate pressure detection signals according to a pressure applied to the pressing header; and an inclination setting module configured to calculate pressing force control values for controlling a bonding pressing force of the loading module based on magnitudes of the pressure detection signals.

In one or more embodiments, the pressure sensing module is: configured to detect a magnitude of pressure applied to the pressing header by using a plurality of pressure sensors located at positions facing different directions; configured to generate the pressure detection signals based on the magnitude of the pressure; and configured to transmit the pressure detection signals to the inclination setting module together with respective position codes for the plurality of pressure sensors using a signal transmission circuit.

In one or more embodiments, the inclination setting module is configured to: detect a magnitude deviation of the pressure detection signals; calculate the pressing force control values of the loading module to zero the magnitude deviation of the pressure detection signals; and transmit the position codes for the plurality of pressure sensors and the pressing force control values to the loading module.

In one or more embodiments, the plurality of pressure sensors are respectively: located at corner positions of an inner stepped portion according to a shape of the inner stepped portion and an insertion hole of the transfer member to which the pressing header is fixed; or located in four axial directions of the inner stepped portion formed in a quadrangular shape, respectively; or arranged in at least one polygonal shape such as a triangle, a pentagon, or a hexagon.

In one or more embodiments, the loading module includes: a flat plate divided into a plurality of block areas and having a plurality of air holes in each of the plurality of block areas; an air supply stage having a plurality of air supply areas respectively corresponding to the plurality of block areas and configured to supply air to the plurality of air holes in at least one of the plurality of block areas; an elastic film layer covering a front surface of the flat plate or a loading surface for loading the large-area fabricating substrate; and a support frame having a sidewall frame having a first opening corresponding to the loading surface of the flat plate and surrounding an outer surface of the loading surface from a side surface.

In one or more embodiments, the plurality of block areas correspond to arrangement positions or arrangement areas of pressure sensors in the pressure sensing module of the element transfer module, respectively.

In one or more embodiments, the plurality of block areas correspond to arrangement positions or arrangement areas of pressure controllers in the transfer driving member of the element transfer module, respectively.

In one or more embodiments, the air supply stage includes a plurality of air injectors configured to generate air based on the pressing force control values and respective position codes for a plurality of pressure sensors inputted from the inclination setting module of the element transfer module, and wherein the plurality of air injectors are respectively located in the plurality of air supply areas.

In one or more embodiments, the plurality of air injectors are matched with arrangement positions and position codes of the plurality of pressure sensors located in the element transfer module, respectively, to generate and inject air based on the pressing force control values for each matched position code.

In one or more embodiments, an air injection intensity and an injection period of each of the plurality of air injectors are set based on magnitudes of the pressing force control values.

In one or more embodiments, the inclination setting module is configured to detect a magnitude deviation of the pressure detection signals detected through the plurality of pressure sensors and to calculate the pressing force control values of the loading module to zero the magnitude deviation of the pressure detection signals, and wherein the plurality of air injectors selectively inject air to each of the plurality of air supply areas based on the pressing force control values for each of the position code matched with the plurality of pressure sensors.

In one or more embodiments, the elastic film layer includes an elastic material selected from a group of silicon, natural rubber, and/or synthetic rubber, or the elastic film layer includes a diaphragm including the elastic material.

In one or more embodiments, an outermost surface of the elastic film layer is attached to an outermost surface of the flat plate along a front outermost surface of the flat plate to seal a front surface of the flat plate.

In one or more embodiments, an outermost surface of the elastic film layer is attached to an outermost surface of the loading surface along the loading surface of the flat plate to seal the loading surface on which the large-area fabricating substrate is loaded.

In one or more embodiments, the support frame is in front of the elastic film layer along an outermost surface of the elastic film layer to press the outermost surface of the elastic film layer and supports side surfaces of the wafer and the large-area fabricating substrate located on a front surface of the elastic film layer corresponding to the loading surface.

In one or more embodiments, a fabricating method of a display panel includes: loading, onto a loading module, a large-area fabricating substrate; and transferring, by an element transfer module, a plurality of light emitting elements or an integrated circuit onto the large-area fabricating substrate, the transferring of the plurality of light emitting elements or the integrated circuit includes: disposing a wafer, on which the plurality of light emitting elements or the integrated circuit is formed, to face the large-area fabricating substrate; bonding and pressing, by the element transfer module, the wafer onto a front surface of the large-area fabricating substrate; and adjusting, by the loading module, an inclination of the large-area fabricating substrate from a rear surface of the large-area fabricating substrate to press the large-area fabricating substrate.

In one or more embodiments, the pressing of the wafer by the element transfer module includes: detecting, by a plurality of pressure sensors in a pressure sensing module, a magnitude of pressure applied to a pressure header of the element transfer module; generating pressure detection signals based on the magnitude of the pressure applied to the pressure header; and transmitting, by a signal transmission circuit, the pressure detection signals together with respective position codes for the plurality of pressure sensors to an inclination setting module.

In one or more embodiments, the pressing of the wafer by the element transfer module further includes: detecting, by the inclination setting module, a magnitude deviation of the pressure detection signals; calculating pressing force control values of the loading module to zero the magnitude deviation of the pressure detection signals; and transmitting respective position codes for the plurality of pressure sensors and the pressing force control values to the loading module.

In one or more embodiments, the pressing of the large-area fabricating substrate by the loading module includes: generating, by a plurality of air injectors, air based on the position codes for the plurality of pressure sensors and the pressing force control values; supplying air through a plurality of air holes in a flat plate; and pressing the rear surface of the large-area fabricating substrate in a direction facing the wafer by an elastic film layer covering the plurality of air holes on a front surface of the flat plate. In accordance with the apparatus for fabricating a display device according to one or more embodiments of the present disclosure, it is possible to increase the fabricating efficiency of the display panel and improve the reliability by precisely and accurately arranging and transferring light emitting diodes onto the display substrate.

Further, by adjusting the inclination of the display substrate from the rear surface of the display substrate using the loading module in response to the inclination of the pressing header for transferring the light emitting diodes, it is possible to reduce or minimize the transfer defect rate of the light emitting diodes and reduce the fabrication cost.

However, aspects and features of embodiments of the present disclosure are not limited to those exemplified above and various other effects, aspects, and features are incorporated herein.

BRIEF DESCRIPTION OF THE DRAWINGS

The above and other aspects and features of the present disclosure will become more apparent by describing in detail embodiments thereof with reference to the attached drawings, in which:

FIG. 10 is a cross-sectional view schematically illustrating a cross section taken along the line A-A' of FIG. 2 according to one or more embodiments;

FIG. 11 is a perspective view schematically illustrating an apparatus for fabricating a display panel according to one or more embodiments;

FIG. 24 is a diagram illustrating a glasses type virtual reality device including a display device according to one or more embodiments;

DETAILED DESCRIPTION

One or more embodiments of the present disclosure will now be described more fully hereinafter with reference to the accompanying drawings, in which embodiments of the present disclosure may, however, be embodied in different forms and should not be construed as limited to the embodiments set forth herein. Rather, these embodiments are provided so that the present disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings and scope of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, one or more embodiments will be described in detail with reference to the accompanying drawings.

Figure 1:
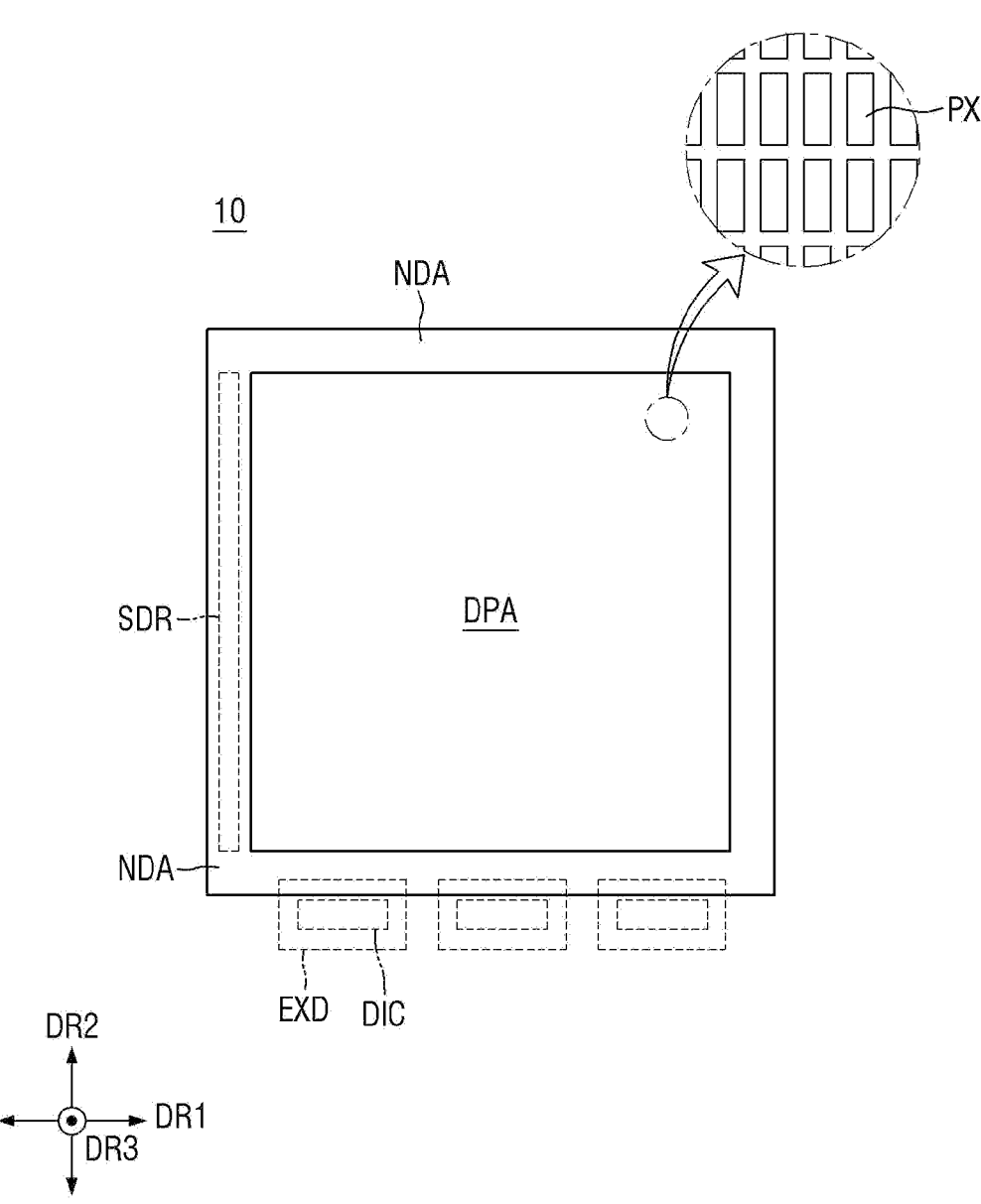
FIG. 1 is a plan view of a display device according to one or more embodiments of the present disclosure.

FIG. 1 is a plan view of a display device according to one or more embodiments of the present disclosure.

Referring to FIG. 1, a display device 10 according to one or more embodiments may be applied to a smartphone, a mobile phone, a tablet PC, a personal digital assistant (PDA), a portable multimedia player (PMP), a television, a game machine, a wristwatch-type electronic device, a head-mounted display, a monitor of a personal computer, a laptop computer, a car navigation system, a car's dashboard, a digital camera, a camcorder, an external billboard, an electronic billboard, a medical device, an inspection device, various household appliances such as a refrigerator and a washing machine, and/or an Internet-of-Things (IoT) device. Herein, a television (TV) is described as an example of a display device, and the TV may have a high resolution or an ultra-high resolution such as HD, UHD, 4K and 8K.

In addition, the display device 10 according to one or more embodiments may be classified into various types according to a display method. Examples of the display device may include an organic light emitting display (OLED) device, an inorganic light emitting display (inorganic EL) device, a quantum dot light emitting display (QED) device, a micro-LED display device, a nano-LED display device, a plasma display device (PDP), a field emission display (FED) device, a cathode ray tube (CRT) display device, a liquid crystal display (LCD) device, an electrophoretic display (EPD) device, and the like. Hereinafter, the micro-LED display device will be described as an example of the display device 10, and the micro-LED display device applied to the embodiment will be simply referred to as a display device unless special distinction is required. However, one or more embodiments are not limited to the micro-LED display device, and other display devices mentioned above or known in the art may be applied within the same scope of technical spirit of the present disclosure.

In addition, in the drawings, a first direction DR1 indicates a horizontal direction of the display device 10, a second direction DR2 indicates a vertical direction of the display device 10, and a third direction DR3 indicates a thickness direction of the display device 10. In this case, "left," "right," "upper" and "lower" indicate directions when the display device 10 is viewed from above. For example, "right side" indicates one side of the first direction DR1, "left side" indicates the other side of the first direction DR1, "upper side" indicates one side of the second direction DR2, and "lower side" indicates the other side of the second direction DR2. Further, "above" indicates one side in the third direction DR3, and "below" indicates the other side in the third direction DR3.

The display device 10 according to one or more embodiments may have a circular shape, an elliptical shape, or a square shape in a plan view, for example, a regular tetragonal shape. In addition, when the display device 10 is a television, it may have a rectangular shape with a long side positioned in the horizontal direction. However, the present disclosure is not limited thereto, and the long side of the display device 1 may extend in a vertical direction. Alternatively, the display device 1 may be installed to be rotatable such that its long side is variably positioned to extend in the horizontal or vertical direction.

The display device 10 may include the display area DPA and a non-display area NDA. The display area DPA may be an active area in which an image is displayed. The display area DPA may have a square shape in plan view similar to the overall shape of the display device 10, but is not limited thereto and may have a circular shape or an elliptical shape.

The display area DPA may include a plurality of pixels PX. The plurality of pixels PX may be arranged in a matrix. For example, the plurality of pixels PX may be arranged along rows and columns of a matrix. The shape of each pixel PX may be rectangular or square in a plan view. However, without being limited thereto, each pixel PX may have a rhombic shape of which each side is inclined with respect to one side direction of the display device 10. The pixels PX may include multiple color pixels PX. For example, the pixels PX may include, a first color pixel PX of red, a second color pixel PX of green, and a third color pixel PX of blue. The present disclosure is not limited thereto, and the plurality of pixels PX may further include a fourth color pixel PX of white. The color pixels PX may be alternately arranged in a stripe type or a PENTILE© structure, or the like. The PENTILE© pixel arrangement structure may be referred to as an RGBG matrix structure (e.g., a PENTILE© matrix structure or an RGBG structure (e.g., a PENTILE© structure)). PENTILE© is a registered trademark of Samsung Display Co., Ltd., Republic of Korea.

The non-display area NDA may be disposed around the display area DPA along an edge or periphery of the display area DPA. The non-display area NDA may completely or partially surround the display area DPA. The display area DPA may have various shapes such as a circle shape or a square shape. The non-display area NDA may be formed to surround the periphery of the display area DPA in response to the shape of the display area DPA. The non-display area NDA may be a bezel portion of the display device 10.

In the non-display area NDA, a driving circuit or a driving element for driving the display area DPA may be disposed. In one or more embodiments, in an area of the non-display area NDA that is disposed adjacent to a first side (lower side in FIG. 1) of the display device 10, a pad portion may be provided on a display substrate of the display device 10, and an external device EXD may be mounted on pad electrodes of the pad portion. Examples of the external device EXD may include a connection film, a printed circuit board, a driver integrated circuit (DIC), a connector, a wire connection film and the like. A scan driver SDR directly formed on the display substrate of the display device 10 may be provided in an area of the non-display area NDA that is disposed adjacent to a second side (left side in FIG. 1) of the display device 10.

Figure 2:
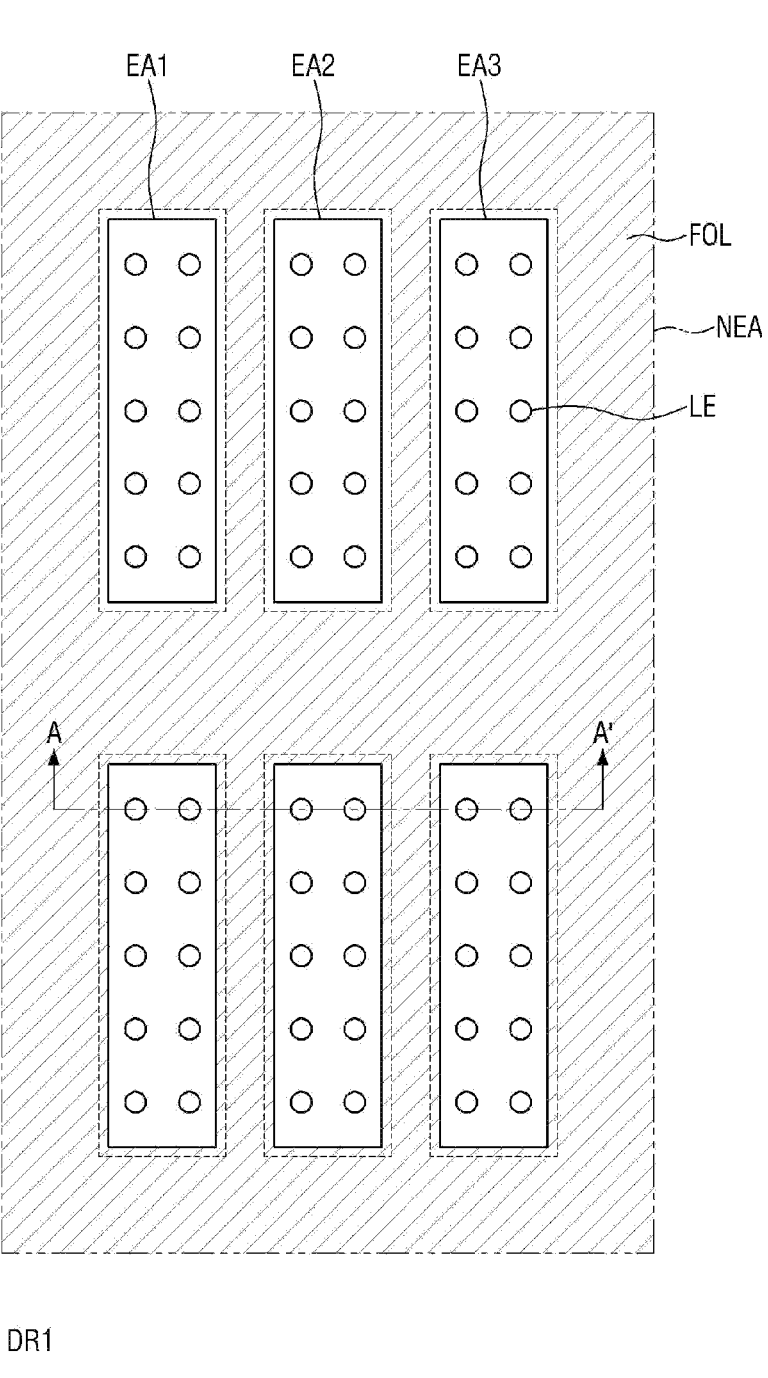
FIG. 2 is a plan view schematically illustrating an emission area of each pixel according to one or more embodiments.
Figure 2:
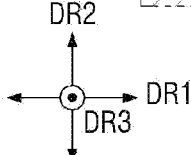

FIG. 2 is a plan view schematically illustrating an emission area of each pixel according to one or more embodiments.

Referring to FIG. 2, the plurality of pixels PX may be arranged in a stripe type in a matrix direction, and the plurality of pixels PX may be divided into a first color pixel PX of red, a second color pixel PX of green, and a third color pixel PX of blue. Further, the plurality of pixels PX may be divided to further include a fourth color pixel PX of white.

The pixel electrode of the first color pixel PX may be positioned in a first emission area EA1 of the first color pixel PX, but at least a part thereof may extend to a non-emission area NEA. The pixel electrode of the second color pixel PX may be positioned in a second emission area EA2 of the second color pixel PX, but at least a part thereof may extend to the non-emission area NEA. The pixel electrode of the third color pixel PX may be positioned in a third emission area EA3 of the third color pixel PX, but at least a part thereof may extend to the non-emission area NEA. A pixel electrode of each pixel PX may penetrate at least one layer of the insulating layers to be connected to any one switching element included in each pixel circuit.

A plurality of light emitting elements LE are disposed on the pixel electrode of the first emission area EA1, the pixel electrode of the second emission area EA2, and the pixel electrode of the third emission area EA3. That is, the light emitting element LE is disposed in each of the first emission area EA1, the second emission area EA2, and the third emission area EA3. In addition, a first color filter of a red color, a second color filter of a green color, and a third color filter of a blue color may be disposed on the first emission area EA1, the second emission area EA2, and the third emission area EA3 in which the plurality of light emitting elements LE are disposed, respectively. A first organic layer FOL may be disposed in the non-emission area NEA.

Figure 3:
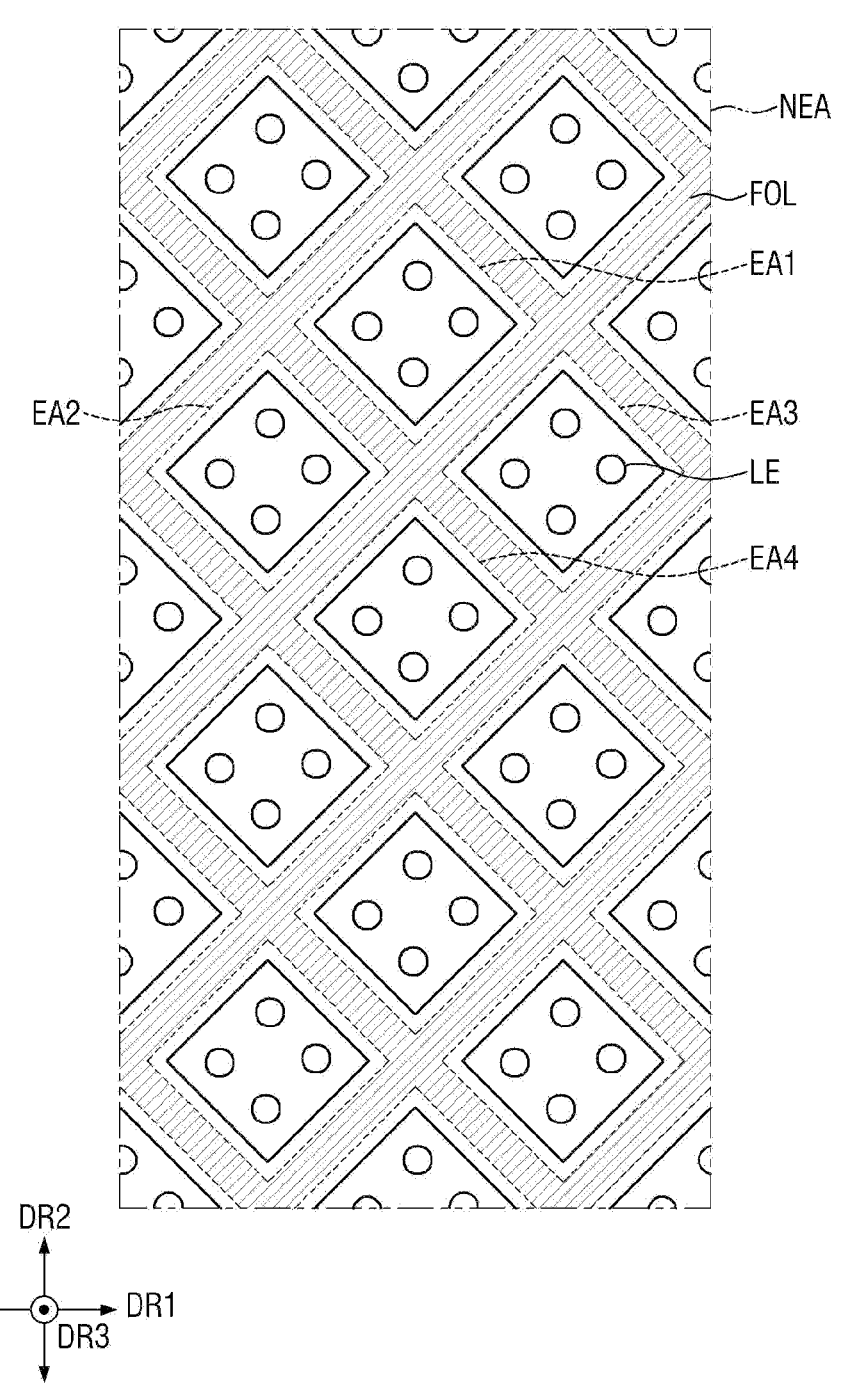
FIG. 3 is a plan view schematically illustrating an emission area of each pixel according to one or more embodiments.

FIG. 3 is a plan view schematically illustrating an emission area of each pixel according to one or more embodiments.

Referring to FIG. 3, the shape of each pixel PX is not limited to a rectangular shape or a square shape in a plan view, and each side of the pixel PX may have a rhombus shape inclined with respect to one side direction of the display device 10 to form a Pentile© matrix structure. Accordingly, in each of the pixels PX of the Pentile© matrix structure, the first emission area EA1 of the first color pixel PX, the second emission area EA2 of the second color pixel PX, the third emission area EA3 of the third color pixel PX, and the fourth emission area EA4 the color pixel PX having the same color as any one of the first to third colors may each be formed in a rhombus shape.

The first to fourth emission areas EA1 to EA4 of each pixel PX may be the same or different in size or planar area. Likewise, the number of light emitting elements LE disposed in each of the first to fourth emission areas EA1 to EA4 may be the same or different.

Specifically, the area of the first emission area EA1, the area of the second emission area EA2, the area of the third emission area EA3, and the area of the fourth emission area EA4 may be substantially the same, but are not limited thereto and may be different from each other. The distance between the first emission area EA1 and the second emission area EA2 adjacent to each other, the distance between the second emission area EA2 and the third emission area EA3 adjacent to each other, the distance between the first emission area EA1 and the third emission area EA3 adjacent to each other, and the distance between the third emission area EA3 and the fourth emission area EA4 adjacent to each other may be substantially the same, but may be different from each other. One or more embodiments of the present disclosure are not limited thereto.

In addition, the first emission area EA1 may emit the first color light, the second emission area EA2 may emit the second color light, and the third emission area EA3 and the fourth emission area EA4 may emit the third color light, but one or more embodiments of the present disclosure are not limited thereto. For example, the first emission area EA1 may emit the second color light, the second emission area EA2 may emit the first color light, and the third and fourth emission areas EA3 and EA4 may emit the third color light. Alternatively, the first emission area EA1 may emit the third color light, the second emission area EA2 may emit the second color light, and the first and fourth emission areas EA3 and EA4 may emit the first color light. Alternatively, at least one emission area of the first to fourth emission areas EA1 to EA4 may emit the fourth color light. The fourth color light may be light of a white or yellow wavelength band. For example, the main peak wavelength of the fourth color light may be positioned at approximately 550 nm to 600 nm, but one or more embodiments of the present disclosure are not limited thereto.

Figure 4:
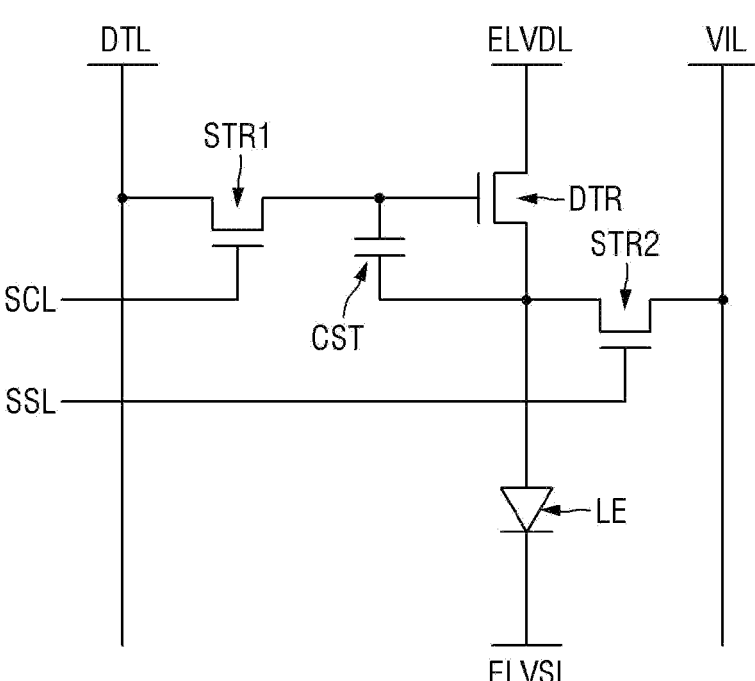
FIG. 4 is an equivalent circuit diagram of a pixel of a display device according to one or more embodiments.

FIG. 4 is an equivalent circuit diagram of a pixel of a display device according to one or more embodiments.

Referring to FIG. 4, each pixel PX may include three transistors DTR, STR1 and STR2 for controlling the light emission of the light emitting elements LE and one capacitor CST for storage. A driving transistor DTR adjusts a current flowing from a first power supply line ELVDL to which the first power voltage is supplied to any one light emitting element LE according to a voltage difference between the gate electrode and the source electrode. The gate electrode of the driving transistor DTR may be connected to the first electrode of a first transistor ST1, the source electrode thereof may be connected to the first electrode of any one light emitting element LE, and the drain electrode thereof may be connected to the first power supply line ELVDL to which the first power voltage is applied.

A first transistor STR1 is turned on by the scan signal of a scan line SCL to connect a data line DTL to the gate electrode of the driving transistor DTR. The gate electrode of the first transistor STR1 may be connected to the scan line SL, the first electrode thereof may be connected to the gate electrode of the driving transistor DTR, and the second electrode thereof may be connected to the data line DTL.

A second transistor STR2 is turned on by the sensing signal of a sensing signal line SSL to connect an initialization voltage line VIL to the source electrode of the driving transistor DTR. The gate electrode of the second transistor ST2 may be connected to the sensing signal line SSL, the first electrode thereof may be connected to the initialization voltage line VIL, and the second electrode thereof may be connected to the source electrode of the driving transistor DTR.

In one or more embodiments, the first electrode of each of the first and second transistors STR1 and STR2 may be a source electrode and the second electrode thereof may be a drain electrode, but the present disclosure is not limited thereto, and may be vice versa.

The capacitor CST is formed between the gate electrode and the source electrode of the driving transistor DTR. The storage capacitor CST stores a difference voltage between a gate voltage and a power voltage of the driving transistor DTR.

The driving transistor DTR, the first transistor STR1, and the second transistor STR2 may be formed as thin film transistors (TFTs). Further, in the description of FIG. 4, it is assumed that the driving transistor DTR, the first switching transistor STR1, and the second switching transistor STR2 are N-type metal oxide semiconductor field effect transistors (MOSFETs), but the present disclosure is not limited thereto. That is, the driving transistor DTR, the first switching transistor STR1, and the second switching transistor STR2 may be P-type MOSFETs, or some of the driving transistor DTR, the first switching transistor STR1, and the second switching transistor STR2 may be N-type MOSFETs, while others may be P-type MOSFETs.

The light emitting elements LE may be connected between the source electrode of the driving transistor DTR and a second power line ELVSL.

Figure 5:
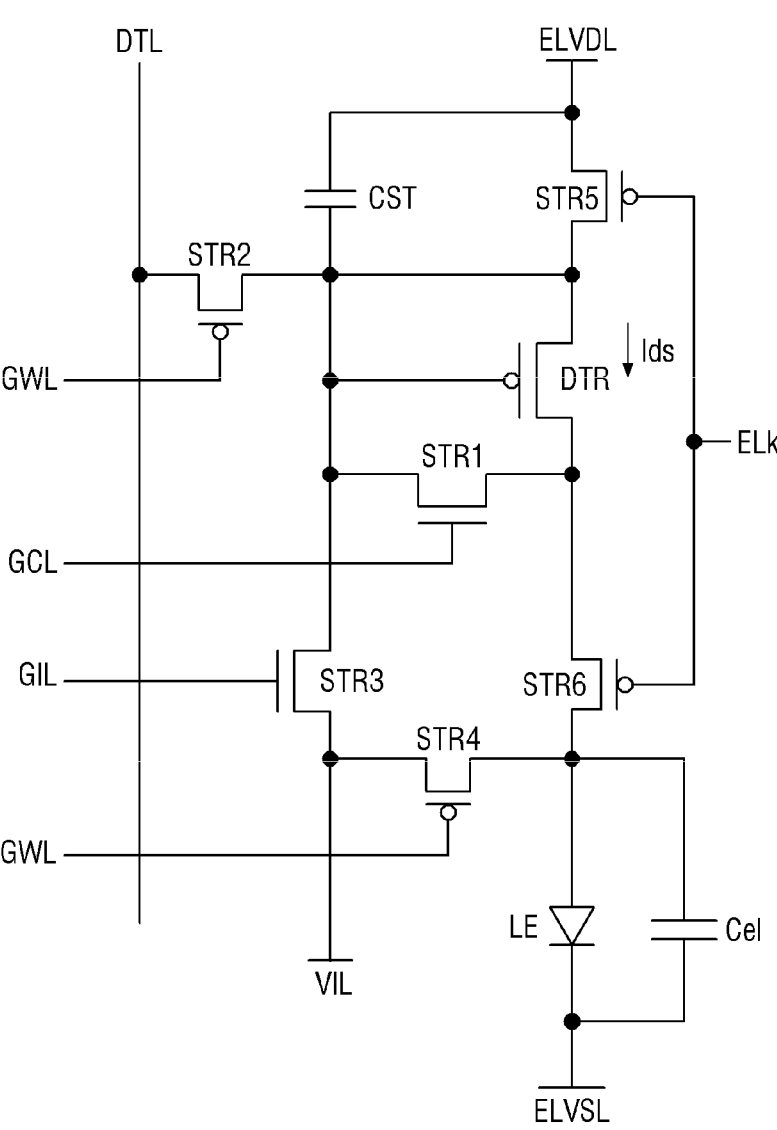
FIG. 5 is an equivalent circuit diagram of a pixel of a display device according to one or more embodiments.

FIG. 5 is an equivalent circuit diagram of a pixels of a display device according to one or more embodiments.

Referring to FIG. 5, each pixel PX may include a capacitor CST, and a driving transistor DTR and a plurality of switch elements for controlling the light emission of the light emitting elements LE. In this case, the plurality of switch elements may include first to sixth transistors STR1, STR2, STR3, STR4, STR5, and STR6.

The driving transistor DTR includes a gate electrode, a first electrode, and a second electrode. The driving transistor DTR controls a drain-source current Ids (hereinafter, referred to as "driving current") flowing between the first electrode and the second electrode of the driving transistor DRT according to a data voltage applied to the gate electrode of the driving transistor DRT.

The capacitor CST is formed between the second electrode of the driving transistor DTR and a second power line ELVSL. One electrode of the capacitor CST may be connected to the second electrode of the driving transistor DTR, and the other electrode thereof may be connected to the second power line ELVSL.

When the first electrode of each of the driving transistor DTR and the first to sixth transistors STR1 to STR6 is a source electrode, the second electrode thereof may be a drain electrode. Alternatively, when the first electrode of each of the driving transistor DTR and the first to sixth transistors STR1 to STR6 is a drain electrode, the second electrode thereof may be a source electrode.

The driving transistor DTR, the second transistor STR2, the fourth transistor STR4, the fifth transistor STR5, and the sixth transistor STR6 may be configured as P-type metal oxide semiconductor field effect transistors (MOSFETs), and the first transistor STR1 and the third transistor STR3 may be configured as N-type MOSFETs. Alternatively, the first to sixth transistors STR1, STR2, STR3, STR4, STR5, STR6, and the driving transistor DTR may be formed of a P-type metal oxide semiconductor field effect transistor (MOSFET).

It should be noted that the equivalent circuit diagram of the pixel according to the above-described embodiment of the present disclosure is not limited to those illustrated in FIGS. 4 and 5. The equivalent circuit diagram of the pixel according to one or more embodiments of the present disclosure may be formed in other known circuit structures that those skilled in the art may employ in addition to the embodiments illustrated in FIGS. 4 and 5.

The first transistor STR1 is connected between the gate electrode and the second electrode of the driving transistor DTR. The gate electrode of the first transistor STR1 is connected to a gate control line GCL.

The second transistor STR2 is connected between the data line DTL and the first electrode of the driving transistor DTR. The gate electrode of the second transistor STR2 is connected to a gate write line GWL.

The third transistor STR3 is connected between the gate electrode of the driving transistor DTR and an initialization voltage line VIL. The gate electrode of the third transistor STR3 is connected to a gate initialization line GIL.

The fourth transistor STR4 is connected between a first electrode of the light emitting element LE and the initialization voltage line VIL. The gate electrode of the fourth transistor STR4 is connected to the gate write line GWL.

The fifth transistor STR5 is connected between the first electrode of the driving transistor DTR and the first power line ELVDL. The gate electrode of the fifth transistor STR5 is connected to an emission control line ELk.

The sixth transistor STR6 is connected between the second electrode of the driving transistor DTR and the first electrode of the light emitting element LE. The gate electrode of the sixth transistor STR6 is connected to the emission control line ELk.

The light emitting element LE is connected between the second electrode of the sixth transistor STR6 and a second power line ELVSL.

A capacitor Cel is connected between the first and second electrodes of the light emitting element LE.

Figure 6:
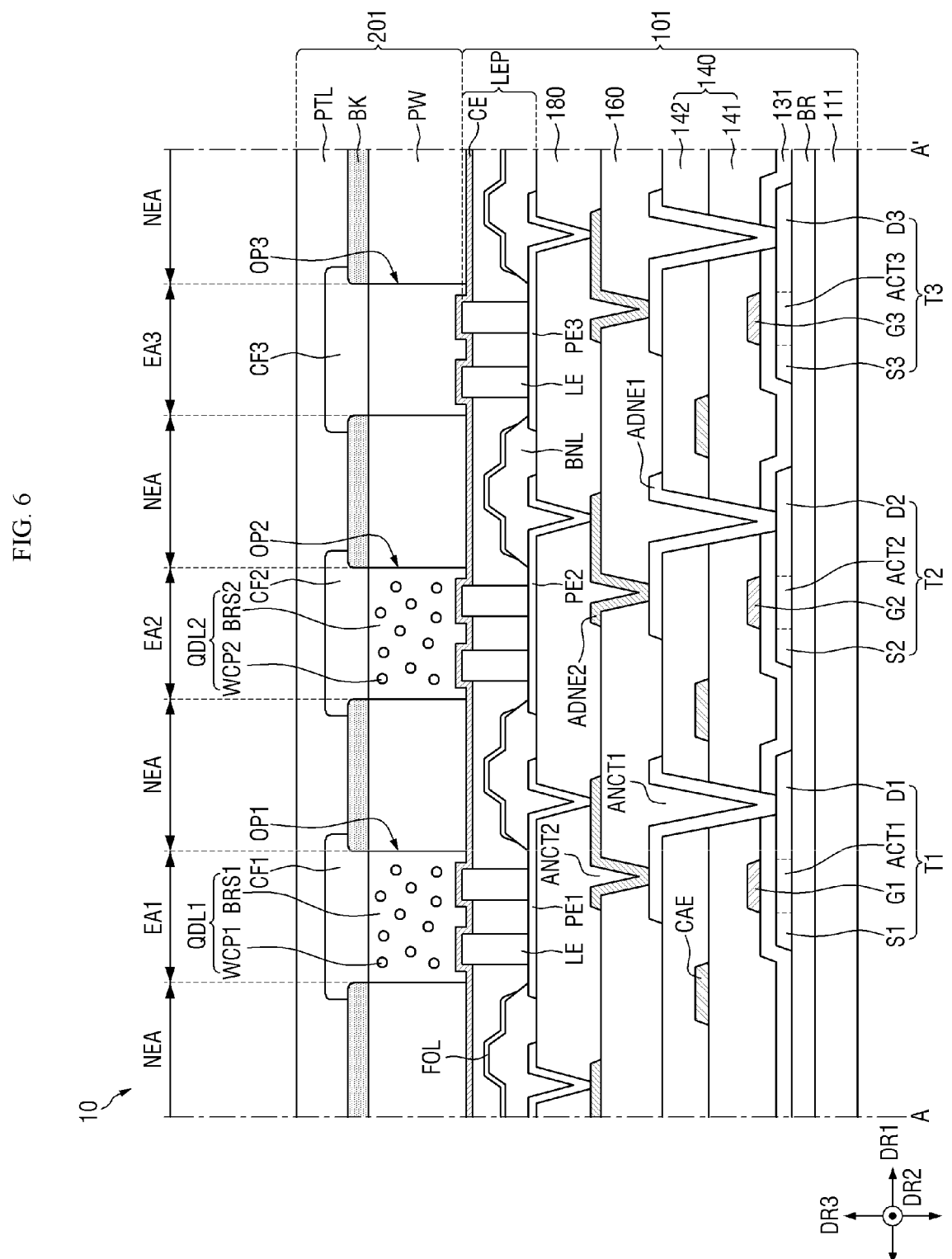
FIG. 6 is a cross-sectional view schematically illustrating a cross section taken along the line A-A' of FIG. 2 according to one or more embodiments.

FIG. 6 is a cross-sectional view schematically illustrating a cross section taken along the line A-A' of FIG. 2 according to one or more embodiments. Further, FIG. 7 is an enlarged view schematically illustrating the first emission area of FIG. 6, and FIG. 8 is a cross-sectional view specifically illustrating the light emitting element of FIG. 7.

Figure 7:
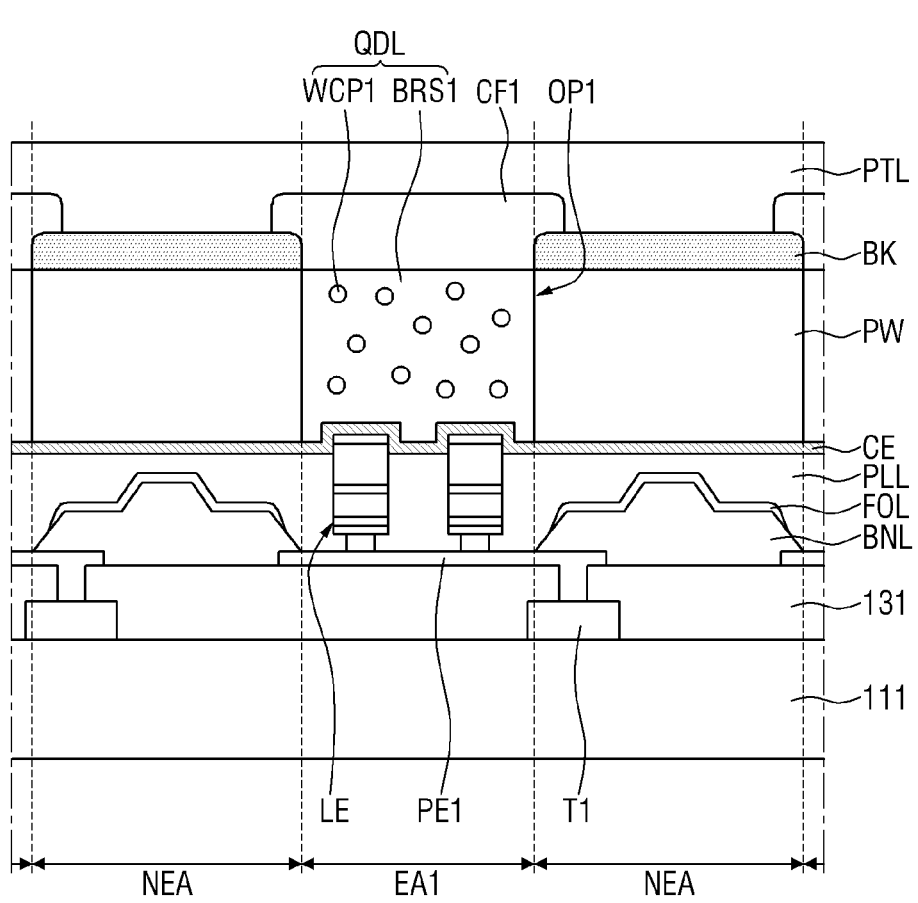
FIG. 7 is an enlarged view schematically illustrating the first emission area of FIG. 6.
Figure 7:
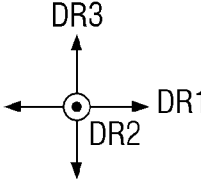
Figure 8:
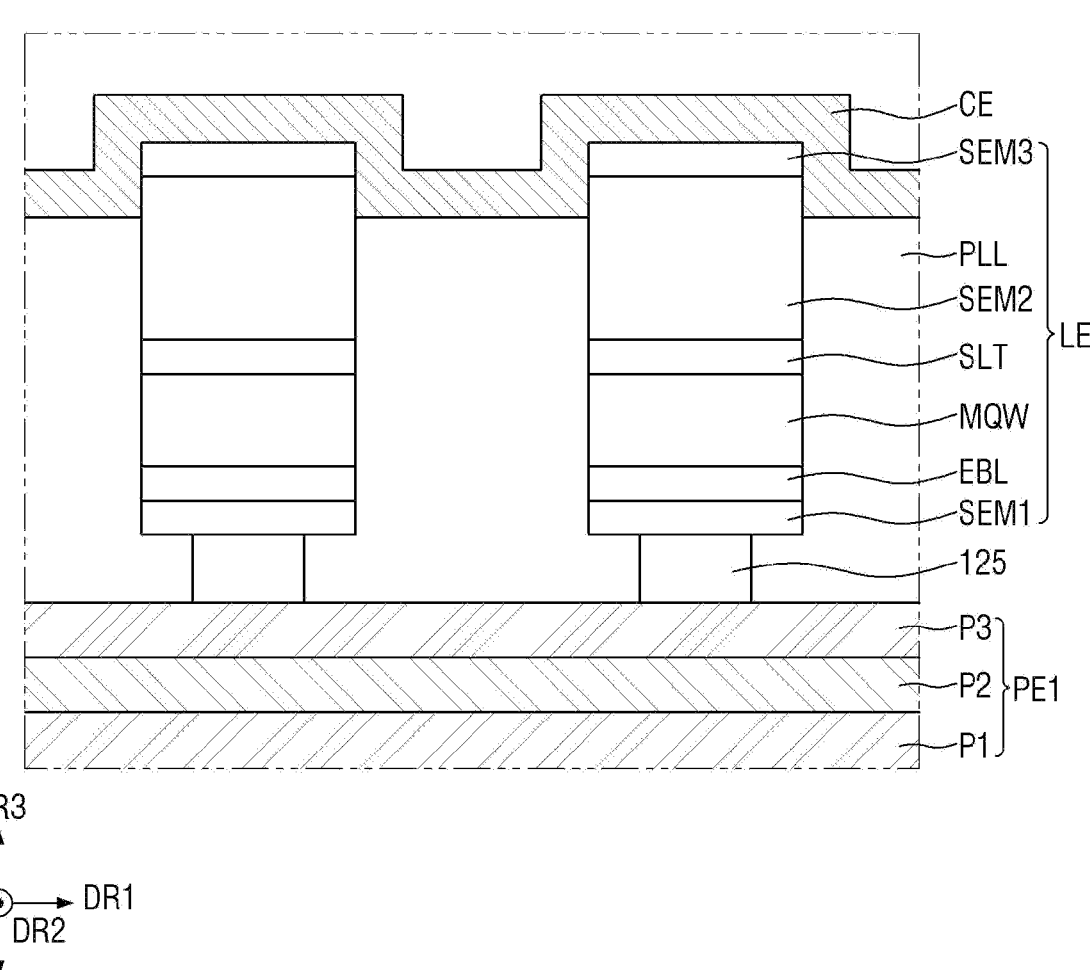
FIG. 8 is a cross-sectional view specifically illustrating the light emitting element of FIG. 7.

Referring to FIGS. 6 to 8, the display panel of the display device 10 may include a display substrate 101 and a wavelength conversion member 201 disposed on the display substrate 101.

A barrier layer BR may be disposed on a first substrate 111 of the display substrate 101. The first substrate 111 may be formed of an insulating material such as a polymer resin. For example, the first substrate 111 may be formed of polyimide. The first substrate 111 may be a flexible substrate which can be bent, folded or rolled.

The barrier layer BR is a layer for protecting thin film transistors T1, T2, and T3 and a light emitting element unit LEP from moisture permeating through the first substrate 111 that is susceptible to moisture permeation. The barrier layer BR may be formed as a plurality of inorganic layers that are alternately stacked. For example, the barrier layer BR may be formed of multiple layers in which one or more inorganic layers of a silicon nitride layer, a silicon oxynitride layer, a silicon oxide layer, a titanium oxide layer and/or an aluminum oxide layer are alternately stacked.

Each of the thin film transistors T1, T2, and T3 may be disposed on the barrier layer BR. The thin film transistors T1, T2, and T3 respectively include active layers ACT1, ACT2, ACT3, gate electrodes G1, G2, G3, source electrodes S1, S2, S3, and drain electrodes D1, D2, D3.

The active layers ACT1, ACT2, ACT3, the source electrodes S1, S2, S3, and the drain electrodes D1, D2, D3 of the thin film transistors T1, T2, and T3 may be disposed on the barrier layer BR. The active layers ACT1, ACT2, ACT3, of the thin film transistors T1, T2, and T3 include polycrystalline silicon, monocrystalline silicon, low-temperature polycrystalline silicon, amorphous silicon, and/or an oxide semiconductor. The active layers ACT1, ACT2, ACT3, overlapping the gate electrodes G1, G2, G3 in the third direction (Z-axis direction) that is the thickness direction of the first substrate 111 may be defined as a channel region. The source electrodes S1, S2, S3 and the drain electrodes D1, D2, D3 that do not overlap the gate electrodes G1, G2, G3 in the third direction (Z-axis direction) may have conductivity by doping a silicon semiconductor and/or an oxide semiconductor with ions or impurities.

The gate insulating layer 131 may be disposed on the active layers ACT1, ACT2, ACT3, the source electrodes S1, S2, S3, and the drain electrodes D1, D2, D3 of the thin film transistors T1, T2, and T3. The gate insulating layer 131 may be formed of an inorganic layer, for example, a silicon nitride layer, a silicon oxynitride layer, a silicon oxide layer, a titanium oxide layer, and/or an aluminum oxide layer.

The gate electrodes G1, G2, G3 of the thin film transistors T1, T2, and T3 may be arranged on the gate insulating layer 131. The gate electrodes G1, G2, G3 may overlap the active layers ACT1, ACT2, ACT3 in the third direction (Z-axis direction). The gate electrodes G1, G2, G3 may be formed as a single layer or multiple layers made of molybdenum (Mo), aluminum (Al), chromium (Cr), gold (Au), titanium (Ti), nickel (Ni), neodymium (Nd) and/or copper (Cu) and/or an alloy thereof.

A first interlayer insulating layer 141 may be disposed on the gate electrodes G1, G2, G3 of the thin film transistors T1, T2, and T3. The first interlayer insulating layer 141 may be formed of an inorganic layer, for example, a silicon nitride layer, a silicon oxynitride layer, a silicon oxide layer, a titanium oxide layer, and/or an aluminum oxide layer. The first interlayer insulating layer 141 may be formed of a plurality of inorganic layers.

A capacitor electrode CAE may be disposed on the first interlayer insulating layer 141. The capacitor electrode CAE may overlap the gate electrodes G1, G2, G3 of the thin film transistors T1, T2, and T3 in the third direction (Z-axis direction). Because the first interlayer insulating layer 141 has a suitable dielectric constant (e.g., a predetermined dielectric constant), the capacitor electrode CAE, the gate electrodes G1, G2, G3, and the first interlayer insulating layer 141 disposed therebetween may form a capacitor. The capacitor electrode CAE may be formed as a single layer or multiple layers made of molybdenum (Mo), aluminum (Al), chromium (Cr), gold (Au), titanium (Ti), nickel (Ni), neodymium (Nd) and/or copper (Cu) and/or an alloy thereof.

A second interlayer insulating layer 142 may be disposed on the capacitor electrode CAE. The second interlayer insulating layer 142 may be formed of an inorganic layer, for example, a silicon nitride layer, a silicon oxynitride layer, a silicon oxide layer, a titanium oxide layer, and/or an aluminum oxide layer. The second interlayer insulating layer 142 may be formed of a plurality of inorganic layers.

The first anode connection electrode ADNE1 may be disposed on the second interlayer insulating layer 142. The first anode connection electrode ADNE1 may be connected to the drain electrodes D1, D2, D3 of the thin film transistors T1, T2, and T3 through a first connection contact hole ANCT1 penetrating the gate insulating layer 131, the first interlayer insulating layer 141, and the second interlayer insulating layer 142. The first anode connection electrode ADNE1 may be formed as a single layer or multiple layers made of molybdenum (Mo), aluminum (Al), chromium (Cr), gold (Au), titanium (Ti), nickel (Ni), neodymium (Nd) and/or copper (Cu), and/or an alloy thereof.

A first planarization layer 160 for flattening a stepped portion formed by the thin film transistors T1, T2, and T3 may be disposed on the first anode connection electrode ADNE1. The first planarization layer 160 may be formed of an organic layer such as acryl resin, epoxy resin, phenolic resin, polyamide resin, polyimide resin and/or the like.

A second anode connection electrode ADNE2 may be disposed on the first planarization layer 160. The second anode connection electrode ADNE2 may be connected to the first anode connection electrode ADNE1 through a second connection contact hole ANCT2 penetrating the first planarization layer 160. The second anode connection electrode ADNE2 may be formed as a single layer or multiple layers made of molybdenum (Mo), aluminum (Al), chromium (Cr), gold (Au), titanium (Ti), nickel (Ni), neodymium (Nd) and/or copper (Cu), or an alloy thereof.

The second planarization layer 180 may be disposed on the second anode connection electrode ADNE2. The second planarization layer 180 may be formed of an organic layer such as acryl resin, epoxy resin, phenolic resin, polyamide resin, polyimide resin, and/or the like.

The light emitting element unit LEP may be formed on the second planarization layer 180. The light emitting element unit LEP may include a plurality of pixel electrodes PE1, PE2, and PE3, the plurality of light emitting elements LE, and a common electrode CE.

The plurality of pixel electrodes PE1, PE2, and PE3 may include the first pixel electrode PE1, the second pixel electrode PE2, and the third pixel electrode PE3. The first pixel electrode PE1, the second pixel electrode PE2, and the third pixel electrode PE3 may serve as a first electrode of the light emitting element LE and may be an anode electrode or a cathode electrode. The first pixel electrode PE1 may be positioned in the first emission area EA1, but at least a part thereof may extend to the non-emission area NEA. The second pixel electrode PE2 may be positioned in the second emission area EA2, but at least a part thereof may extend to the non-emission area NEA. The third pixel electrode PE3 may be positioned in the third emission area EA3, but at least a part thereof may extend to the non-emission area NEA. The first pixel electrode PE1 may penetrate the second planarization layer 180 to be connected to the first switching element T1 via the second anode connection electrode ADNE2 and the first anode connection electrode ADNE1, the second pixel electrode PE2 may penetrate the second planarization layer 180 to be connected to the second switching element T2 via the second anode connection electrode ADNE2 and the first anode connection electrode ADNE1, and the third pixel electrode PE3 may penetrate the second planarization layer 180 to be connected to the third switching element T3 via the second anode connection electrode ADNE2 and the first anode connection electrode ADNE1.

The first pixel electrode PE1, the second pixel electrode PE2, and the third pixel electrode PE3 may be reflective electrodes. The first pixel electrode PE1, the second pixel electrode PE2, and the third pixel electrode PE3 may be formed of titanium (Ti), copper (Cu), and/or an alloy material of titanium (Ti) and/or copper (Cu). In addition, it may have a stacked structure of titanium (Ti) and/or copper (Cu). In addition, the first pixel electrode PE1, the second pixel electrode PE2, and the third pixel electrode PE3 may have a stacked structure formed by stacking a material layer having a high work function, such as titanium oxide ($TiO_2$), indium tin oxide (ITO), indium zinc oxide (IZO), zinc oxide (ZnO), indium tin zinc oxide (ITZO), or magnesium oxide (MgO), and a reflective material layer such as silver (Ag), magnesium (Mg), aluminum (Al), platinum (Pt), lead (Pb), gold (Au), nickel (Ni), neodymium (Nd), iridium (Ir), chromium (Cr), lithium (Li), calcium (Ca), Titanium (Ti), copper (Cu), and/or a mixture thereof. The material layer having a high work function may be disposed above the reflective material layer and disposed closer to the light emitting element LE. The first pixel electrode PE1, the second pixel electrode PE2, and the third pixel electrode PE3 may have a multilayer structure of ITO/Mg, ITO/MgF, ITO/Ag, and/or ITO/Ag/ITO, but are not limited thereto.

A bank BNL may be positioned on the first pixel electrode PE1, the second pixel electrode PE2, and the third pixel electrode PE3. The bank BNL may include an opening hole exposing the first pixel electrode PE1, an opening hole exposing the second pixel electrode PE2, and an opening hole exposing the third pixel electrode PE3, and may define the first emission area EA1, the second emission area EA2, the third emission area EA3, and the non-emission area NEA. That is, an area of the first pixel electrode PE1 that is not covered by the bank BNL and is exposed may be the first emission area EA1. An area of the second pixel electrode PE2 that is not covered by the bank BNL and is exposed may be the second emission area EA2. An area of the third pixel electrode PE3 that is not covered by the bank BNL and is exposed may be the third emission area EA3. In addition, an area in which the bank BNL is positioned may be the non-emission area NEA.

The bank BNL may include an inorganic insulating material, for example, acrylic resin, epoxy resin, phenolic resin, polyamide resin, polyimide resin, unsaturated polyester resin, polyphenylene resin, polyphenylenesulfide resin, benzocyclobutene (BCB), and/or the like.

In one or more embodiments, the bank BNL may not overlap the color filters CF1, CF2, and CF3 and may overlap a light blocking member BK of the wavelength conversion member 201, which will be described later. In one or more embodiments, the bank BNL may completely overlap the light blocking member BK. In addition, in one or more embodiments, the bank BNL may overlap the first color filter CF1, the second color filter CF2, and the third color filter CF3.

The plurality of light emitting elements LE may be disposed on the first pixel electrode PE1, the second pixel electrode PE2, and the third pixel electrode PE3.

As illustrated in FIGS. 7 and 8, the light emitting element LE may be disposed in each of the first emission area EA1, the second emission area EA2, and the third emission area EA3. The light emitting element LE may be a vertical light emitting diode element elongated in the third direction DR3. That is, the length of the light emitting element LE in the third direction DR3 may be longer than the length thereof in the horizontal direction. The length in the horizontal direction indicates a length in the first direction DR1 or a length in the second direction DR2. For example, the length of the light emitting element LE in the third direction DR3 may be approximately 1 to 5 μm.

The light emitting element LE may be a micro light emitting diode element. The light emitting element LE may include a connection electrode 125, a first semiconductor layer SEM1, an electron blocking layer EBL, an active layer MQW, a superlattice layer SLT, a second semiconductor layer SEM2, and a third semiconductor layer SEM3, in the thickness direction of the display substrate 101, that is, the third direction DR3. The connection electrode 125, the first semiconductor layer SEM1, the electron blocking layer EBL, the active layer MQW, the superlattice layer SLT, the second semiconductor layer SEM2, and the third semiconductor layer SEM3 may be sequentially stacked in the third direction DR3.

The light emitting element LE may have a cylindrical shape that is longer in width than in height, a disc shape, or a rod shape. However, the present disclosure is not limited thereto, and the light emitting element LE may have various shapes, such as a rod shape, a wire shape, a tube shape, a polygonal prism shape such as a regular cube, a rectangular parallelepiped and a hexagonal prism, or a shape extending in one direction and having a partially inclined outer surface.

The connection electrode 125 may be disposed on each of the plurality of pixel electrodes PE1, PE2, and PE3. Hereinafter, the light emitting element LE disposed on the first pixel electrode PE1 will be described as an example.

The connection electrode 125 may be on the first pixel electrode PE1 to be connected to the first pixel electrode PE1, so that the light emitting element LE may receive an emission signal. The connection electrode 125 may be an ohmic connection electrode. However, the present disclosure is not limited thereto, and it may be a Schottky connection electrode. The light emitting element LE may include at least one connection electrode 125. FIGS. 7 and 8 illustrate that the light emitting element LE includes one connection electrode 125, but is not limited thereto. In some cases, the light emitting element LE may include a larger number of connection electrodes 125 or may not have the connection electrode 125. The following description of the light emitting element LE may be equally applied even if the number of connection electrodes 125 is different or other structures are further included.

When the light emitting element LE is electrically connected to the first pixel electrode PE1 in the display device 10 according to one or more embodiments, the connection electrode 125 may reduce the resistance and improve the adhesion between the light emitting element LE and the first pixel electrode PE1. The connection electrode 125 may include a conductive metal oxide. For example, the connection electrode 125 may be ITO. Because the connection electrode 125 is directly in contact with and connected to the lower first pixel electrode PE1, the connection electrode 125 may be made of the same material as the first pixel electrode PE1. In addition, the connection electrode 125 may selectively further include a reflective electrode made of a metal material having a high reflectivity such as aluminum (Al) and/or a diffusion barrier layer including nickel (Ni). Accordingly, adhesion between the connection electrode 125 and the first pixel electrode PE1 may be improved, and thus a contact characteristic may be increased.

Referring to FIG. 8, in one or more embodiments, the first pixel electrode PE1 may include a lower electrode layer P1, a reflective layer P2, and an upper electrode layer P3. The lower electrode layer P1 may be disposed at the lowermost portion of the first pixel electrode PE1 and may be electrically connected from the switching element. The lower electrode layer P1 may include a metal oxide, and may include, for example, titanium oxide ($TiO_2$), indium tin oxide (ITO), indium zinc oxide (IZO), zinc oxide (ZnO), indium tin zinc oxide (ITZO), magnesium oxide (MgO), and/or the like.

The reflective layer P2 may be disposed on the lower electrode layer P1 to reflect light emitted from the light emitting element LE upward. The reflective layer P2 may include a metal having high reflectivity, may include, for example, silver (Ag), magnesium (Mg), aluminum (Al), platinum (Pt), lead (Pd), gold (Au), nickel. (Ni), neodium (Nd), iridium (Ir), chromium (Cr), lithium (Li), calcium (Ca), and/or a mixture thereof.

The upper electrode layer P3 may be disposed on the reflective layer P2 and may be directly in contact with the light emitting element LE. The upper electrode layer P3 may be disposed between the reflective layer P2 and the connection electrode 125 of the light emitting element LE, and may be directly in contact with the connection electrode 125. As described above, the connection electrode 125 is made of a metal oxide, and the upper electrode layer P3 may also be made of a metal oxide in the same way as the connection electrode 125.

The upper electrode layer P3 may be formed of titanium (Ti), copper (Cu), or an alloy material of titanium (Ti) and/or copper (Cu). In addition, the upper electrode layer P3 may have a stacked structure of titanium (Ti) and/or copper (Cu). In addition, the upper electrode layer P3 may include titanium oxide ($TiO_2$), indium tin oxide (ITO), indium zinc oxide (IZO), zinc oxide (ZnO), indium tin zinc oxide (ITZO), and/or magnesium oxide (MgO). In one or more embodiments, when the connection electrode 125 is made of ITO, the first pixel electrode PE1 may have a multilayer structure of ITO/Ag/ITO.

The first semiconductor layer SEM1 may be disposed on the connection electrode 125. The first semiconductor layer SEM1 may be a p-type semiconductor, and may include a semiconductor material having a chemical formula of $Al_xGa_yIn_{1-x-y}N$ ($0 \le x \le 1$, $0 \le y \le 1$, $0 \le x+y \le 1$). For example, the semiconductor material may be one or more of p-type doped AlGaInN, GaN, AlGaN, InGaN, AlN, and/or InN. The first semiconductor layer SEM1 may be doped with a p-type dopant, and the p-type dopant may be Mg, Zn, Ca, Se, Ba, and/or the like. For example, the first semiconductor layer SEM1 may be p-GaN doped with p-type Mg. The thickness of the first semiconductor layer SEM1 may be in a range of 30 nm to 200 nm, but is not limited thereto.

The electron blocking layer EBL may be disposed on the first semiconductor layer SEM1. The electron blocking layer EBL may be a layer for suppressing or preventing too many electrons from flowing into the active layer MQW. For example, the electron blocking layer EBL may be p-AlGaN doped with p-type Mg. The thickness of the electron blocking layer EBL may be within a range of 10 nm to 50 nm, but the present disclosure is not limited thereto. Further, the electron blocking layer EBL may be omitted.

The active layer MQW may be disposed on the electron blocking layer EBL. The active layer MQW may emit light by coupling of electron-hole pairs according to an electrical signal applied through the first semiconductor layer SEM1 and the second semiconductor layer SEM2.

The active layer MQW may include a material having a single or multiple quantum well structure. When the active layer MQW contains a material having a multiple quantum well structure, the active layer MQW may have the structure in which a plurality of well layers and barrier layers are alternately laminated. At this time, the well layer may be formed of InGaN, and the barrier layer may be formed of GaN or AlGaN, but the present disclosure is not limited thereto. The thickness of the well layer may be approximately 1 to 4 nm, and the thickness of the barrier layer may be 3 nm to 10 nm.

Alternatively, the active layer MQW may have a structure in which semiconductor materials having large band gap energy and semiconductor materials having small band gap energy are alternately stacked, and may include other Group III to Group V semiconductor materials according to the wavelength band of the emitted light. The light emitted by the active layer MQW is not limited to the first light, and in some cases, the second light (light of the green wavelength band) or the third light (light of the red wavelength band) may be emitted.

Specifically, the color of the light emitted from the active layer MQW may vary according to the content of indium (In). For example, as the content of indium (In) increases or becomes higher, the wavelength band of light emitted by the active layer may shift to a red wavelength band, and as the content of indium (In) decreases or becomes lower, the wavelength band of light emitted by the active layer may shift to a blue wavelength band.

For example, when the content of indium (In) is 35% or more, the active layer MQW may emit the first light in the red wavelength band having a main peak wavelength in a range of approximately 600 nm to 750 nm. Alternatively, when the content of indium (In) is 25%, the active layer MQW may emit the second light in the green wavelength band having a main peak wavelength in a range of approximately 480 nm to 560 nm. Alternatively, when the content of indium (In) is 15% or less, the active layer MQW may emit the third light in the blue wavelength band having a main peak wavelength in a range of approximately 370 nm to 460 nm. An example in which the active layer MQW emits light in the blue wavelength band having a main peak wavelength of approximately 370 nm to 460 nm will be described with reference to FIG. 6.

The superlattice layer SLT may be disposed on the active layer MQW. The superlattice layer SLT may be a layer for relieving stress between the second semiconductor layer SEM2 and the active layer MQW. For example, the superlattice layer SLT may be formed of InGaN, and/or GaN. The thickness of the superlattice layer SLT may be about 50 nm to 200 nm. The superlattice layer SLT may be omitted.

The second semiconductor layer SEM2 may be disposed on the superlattice layer SLT. The second semiconductor layer SEM2 may be an n-type semiconductor. The second semiconductor layer SEM2 may include a semiconductor material having a chemical formula of $AlxGayIn1-x-yN$ ($0 \leq x \leq 1$, $0 \leq y \leq 1$, $0 \leq x+y \leq 1$). For example, it may be one or more of an n-type doped AlGaInN, GaN, AlGaN, InGaN, AlN, and/or InN. The second semiconductor layer SEM2 may be doped with an n-type dopant, and the n-type dopant may be Si, Ge, Sn, or the like. For example, the second semiconductor layer SEM2 may be n-GaN doped with n-type Si. The thickness of the second semiconductor layer SEM2 may be within a range of 2 μm to 4 μm, but the present disclosure is not limited thereto.

The third semiconductor layer SEM3 may be disposed on the second semiconductor layer SEM2. The third semiconductor layer SEM3 may be disposed between the second semiconductor layer SEM2 and the common electrode CE. The third semiconductor layer SEM3 may be an undoped semiconductor. The third semiconductor layer SEM3 may contain the same material as that of the second semiconductor layer SEM2, and may contain a material that is not doped with an n-type or p-type dopant. In one or more embodiments, the third common semiconductor layer SEM3 may be, but is not limited to, at least one of undoped InAlGaN, GaN, AlGaN, InGaN, AlN, and/or InN.

A planarization layer PLL may be disposed on the bank BNL and the plurality of pixel electrodes PE1, PE2, and PE3. The planarization layer PLL may planarize a lower step so that the common electrode CE, which will be described later, may be formed. The planarization layer PLL may be formed to have a suitable height (e.g., a predetermined height) so that at least a part, for example, an upper portion, of the plurality of light emitting elements LE, may protrude above the planarization layer PLL. That is, the height of the planarization layer PLL with respect to the top surface of the first pixel electrode PE1 may be smaller than the height of the light emitting element LE in the third direction DR3.

The planarization layer PLL may include an organic material to planarize the lower step. For example, the planarization layer PLL may include acrylic resin, epoxy resin, phenolic resin, polyamide resin, polyimide resin, unsaturated polyester resin, polyphenylene resin, polyphenylenesulfide resin, benzocyclobutene (BCB), and/or the like.

The common electrode CE may be disposed on the planarization layer PLL and the plurality of light emitting elements LE. Specifically, the common electrode CE may be disposed on one surface of the first substrate 111 on which the light emitting element LE is formed, and may be disposed entirely in the display area DPA and the non-display area NDA. The common electrode CE is disposed to overlap each of the emission areas EA1, EA2, and EA3 in the display area DPA, and may have a thin thickness to allow light to be emitted.

The common electrode CE may be directly disposed on the top surface and the side surface of the plurality of light emitting elements LE. The common electrode CE may be directly in contact with the second semiconductor layer SEM2 on the side surfaces of the light emitting element LE and the third semiconductor layer SEM3 on the top surface and the side surfaces of the light emitting element LE. As illustrated in FIG. 6, the common electrode CE may be a common layer that covers the plurality of light emitting elements LE and is disposed by commonly connecting the plurality of light emitting elements LE. Because the second semiconductor layer SEM2 having conductivity has a patterned structure in each of the light emitting elements LE, the common electrode CE may be directly in contact with the side surface of the second semiconductor layer SEM2 of each of the light emitting elements LE so that a common voltage may be applied to each of the light emitting elements LE.

Because the common electrode CE is entirely disposed on the first substrate 111 and a common voltage is applied, the common electrode CE may include a material having a low resistance. In addition, the common electrode CE may be formed to have a thin thickness to allow light to pass therethrough. For example, the common electrode CE may include a material having a low resistance, such as aluminum (Al), silver (Ag), copper (Cu), and/or the like. The thickness of the common electrode CE may be approximately 10 Å to 200 Å, but is not limited thereto.

The above-described light emitting elements LE may be supplied with a pixel voltage or an anode voltage from a pixel electrode through the connection electrode 125, and may be supplied with a common voltage through the common electrode CE. The light emitting element LE may emit light with a desired luminance (e.g., a predetermined luminance) according to a voltage difference between the pixel voltage and the common voltage.

In the described embodiment, by disposing the plurality of light emitting elements LE, that is, inorganic light emitting diodes on the pixel electrodes PE1, PE2, and PE3, the disadvantages of organic light emitting diodes, which may be vulnerable to external moisture or oxygen, may be excluded, and lifespan and reliability may be improved.

In one or more embodiments, the first organic layer FOL may be disposed on the bank BNL disposed in the non-emission area NEA.

The first organic layer FOL may overlap the non-emission area NEA in the third direction DR3 and may be disposed not to overlap the emission areas EA1, EA2, and EA3. The first organic layer FOL may be disposed directly on the bank BNL and may be disposed to be spaced apart from a plurality of adjacent pixel electrodes PE1, PE2, and PE3. The first organic layer FOL may be disposed on the entire first substrate 111, and may be disposed to be around (e.g., to surround) the plurality of emission areas EA1, EA2, and EA3. The first organic layer FOL may be disposed in a lattice shape as a whole.

The first organic layer FOL may serve to detach the plurality of light emitting elements LE in contact with the first organic layer FOL, which is the non-emission area NEA, as will be described in a fabricating process to be described later. When the laser light is irradiated, the first organic layer FOL absorbs energy and instantaneously increases its temperature to be ablated. Accordingly, the plurality of light emitting elements LE in contact with the top surface of the first organic layer FOL may be detached from the top surface of the first organic layer FOL.

The first organic layer FOL may contain a polyimide-based compound. The polyimide-based compound of the first organic layer FOL may have a cyano group to absorb light having a wavelength of 308 nm, e.g., laser light. In one or more embodiments, each of the first organic layer FOL and the bank BNL may include a polyimide-based compound, but may include different polyimide-based compounds. For example, the bank BNL may be formed of a polyimide-based compound not including a cyano group, and the first organic layer FOL may be formed of a poly-imide-based compound including a cyano group. For laser light having a wavelength of 308 nm, the transmittance of the first organic layer FOL may be less than the transmit-tance of the bank BNL, the transmittance of the bank BNL is about 60% or more, and the transmittance of the first organic layer FOL may be 0%. In addition, the absorption rate of the first organic layer FOL with respect to laser light having a wavelength of 308 nm may be 100%. The first organic layer FOL may have a thickness in a range of about 2 Å to 10 μm. When the thickness of the first organic layer FOL is 2 Å or more, the absorption rate of laser light having a wavelength of 308 nm may be improved. When the thickness of the first organic layer FOL is 10 μm or less, the height difference between the first organic layer FOL and the pixel electrode PE1 may be prevented from increasing, so that the light emitting element LE may be easily adhered onto the pixel electrode in a process to be described later.

The wavelength conversion member 201 may be disposed on the light emitting element unit LEP. The wavelength conversion member 201 may include a partition wall PW, a wavelength conversion layer QDL, the color filters CF1, CF2, and CF3, the light blocking member BK, and a first passivation layer PTL.

The partition wall PW may be disposed on the common electrode CE of the display area DPA, and may partition the plurality of emission areas EA1, EA2, and EA2 together with the bank BNL. The partition wall PW may be disposed to extend in the first direction DR1 and the second direction DR2, and may be formed in a grid pattern in the entire display area DPA. Further, the partition wall PW may not overlap the plurality of emission areas EA1, EA2, and EA3, and may overlap the non-emission area NEA.

The partition wall PW may include a plurality of opening holes OP1, OP2, and OP3 exposing the lower common electrode CE. The plurality of opening holes OP1, OP2, and OP3 may include a first opening hole OP1 overlapping the first emission area EA1, a second opening hole OP2 over-lapping the second emission area EA2, and a third opening hole OP3 overlapping the third emission area EA3. Here, the plurality of opening holes OP1, OP2, and OP3 may corre-spond to the plurality of emission areas EA1, EA2, and EA3. That is, the first opening hole OP1 may correspond to the first emission area EA1, the second opening hole OP2 may correspond to the second emission area EA2, and the third opening hole OP3 may correspond to the third emission area EA3.

The partition wall PW may serve to provide a space for first and second wavelength conversion layers QDL1 and QDL2 to be formed. To this end, the partition wall PW may have a suitable thickness (e.g., a predetermined thickness). For example, the thickness of the partition wall PW may be in the range of 1 μm to 10 μm. The partition wall PW may contain an organic insulating material to have a predeter-mined thickness. The organic insulating material may con-tain, for example, epoxy resin, acrylic resin, cardo resin or imide resin.

The first wavelength conversion layer QDL1 may be disposed in each of the first opening holes OP1. The first wavelength conversion layer QDL1 may be formed of an island pattern in a shape of dots spaced from each other. The first wavelength conversion layer QDL1 may include a first base resin BRS1 and a first wavelength conversion particle WCP1. The first base resin BRS1 may include a light-transmissive organic material. For example, the first base resin BRS1 may contain epoxy resin, acrylic resin, cardo resin, or imide resin. The first wavelength conversion par-ticle WCP1 may be a quantum dot (QD), a quantum rod, a fluorescent material, or a phosphorescent material. For example, a quantum dot may be a particulate material that emits light of a specific color when an electron transitions from a conduction band to a valence band.

The quantum dot may be a semiconductor nanocrystal material. The quantum dot may have a specific band gap according to its composition and size. Thus, the quantum dot may absorb light and then emit light having an intrinsic wavelength. Examples of semiconductor nanocrystal of quantum dots may include Group IV nanocrystal, Group II-VI compound nanocrystal, Group III-V compound nanoc-rystal, Group IV-VI nanocrystal, a combination thereof, and/or the like.

The first wavelength conversion layer QDL1 may be formed in the first opening hole OP1 of the first emission area EA1. The first wavelength conversion layer QDL1 may emit light by converting or shifting the peak wavelength of incident light to another specific peak wavelength. The first wavelength conversion layer QDL1 may convert a part of the blue light emitted from the light emitting element LE into light similar to red light, which is the first light. The first wavelength conversion layer QDL1 may emit light similar to red light and thus may perform conversion into red light, which is the first light, through the first color filter CF1.

The second wavelength conversion layer QDL2 may be disposed in each of the second opening holes OP2. The second wavelength conversion layer QDL2 may be formed of an island pattern in a shape of dots spaced from each other. For example, the second wavelength conversion layer QDL2 may be disposed to overlap the second emission area EA2. The second wavelength conversion layer QDL2 may include a second base resin BRS2 and a second wavelength conversion particle WCP2. The second base resin BRS2 may contain a light-transmissive organic material. Accord-ingly, the second wavelength conversion layer QDL2 may emit light by converting or shifting the peak wavelength of incident light to another specific peak wavelength. The second wavelength conversion layer QDL2 may convert a part of the blue light emitted from the light emitting element LE into light similar to green light, which is the second light. The second wavelength conversion layer QDL2 may emit light similar to green light and thus may perform conversion into red light, which is the first light, through the second color filter CF2.

In the third emission area EA3, only a transparent light-transmissive organic material may be formed in the third opening hole OP3 so that the blue light emitted from the light emitting element LE may be emitted through the third color filter CF3 as it is.

The plurality of color filters CF1, CF2, and CF3 may be disposed on the partition wall PW and the first and second wavelength conversion layers QDL1 and QDL2. The plurality of color filters CF1, CF2, and CF3 may be disposed to overlap the plurality of opening holes OP1, OP2, OP3 and the first and second wavelength conversion layers QDL1 and QDL2. The plurality of color filters CF1, CF2, and CF3 may include a first color filter CF1, a second color filter CF2, and a third color filter CF3.

The first color filter CF1 may be disposed to overlap the first emission area EA1. In addition, the first color filter CF1 may be disposed on the first opening hole OP1 of the partition wall PW to overlap the first opening hole OP1. The first color filter CF1 may transmit the first light emitted from the light emitting element LE and absorb or block the second light and the third light. For example, the first color filter CF1 may transmit light of a blue wavelength band and absorb or block light of other wavelength bands such as green and red.

The second color filter CF2 may be disposed to overlap the second emission area EA2. In addition, the second color filter CF2 may be disposed on the second opening hole OP2 of the partition wall PW to overlap the second opening hole OP2. The second color filter CF2 may transmit the second light and absorb or block the first light and the third light. For example, the second color filter CF2 may transmit light of a green wavelength band and absorb or block light of other wavelength bands such as blue and red.

The third color filter CF3 may be disposed to overlap the third emission area EA3. In addition, the third color filter CF3 may be disposed on the third opening hole OP3 of the partition wall PW to overlap the third opening hole OP3. The third color filter CF3 may transmit the third light and absorb or block the first light and the second light. For example, the third color filter CF3 may transmit light of a red wavelength band and absorb or block light of other wavelength bands such as blue and green.

A planar area of each of the plurality of color filters CF1, CF2, and CF3 may be larger than a planar area of each of the plurality of emission areas EA1, EA2, and EA3. For example, the first color filter CF1 may have a larger planar area than the first emission area EA1. The second color filter CF2 may have a larger planar area than the second emission area EA2. The third color filter CF3 may have a larger planar area than the third emission area EA3. However, the present disclosure is not limited thereto, and a planar area of each of the plurality of color filters CF1, CF2, and CF3 may be the same as a planar area of each of the plurality of emission areas EA1, EA2, and EA3.

Referring to FIG. 6, the light blocking member BK may be disposed on the partition wall PW. The light blocking member BK may overlap the non-emission area NEA to block transmission of light. The light blocking member BK may be disposed approximately in a lattice shape in a plan view similar to the bank BNL or the partition wall PW. The light blocking member BK may be disposed to overlap the bank BNL, the first organic layer FOL, and the partition wall PW, and may not overlap the emission areas EA1, EA2, and EA3.

In one or more embodiments, the light blocking member BK may contain an organic light blocking material, and may be formed by a process of coating and exposing the organic light blocking material. The light blocking member BK may include a dye or a pigment having a light blocking property, and may be a black matrix. At least a part of the light blocking member BK may overlap the adjacent color filters CF1, CF2, and CF3, and the color filters CF1, CF2, and CF3 may be disposed on at least a part of the light blocking member BK.

The first passivation layer PTL may be disposed on the plurality of color filters CF1, CF2, and CF3 and the light blocking member BK. The first passivation layer PTL may be disposed on the uppermost portion of the display device 10 to protect the lower plurality of color filters CF1, CF2, and CF3 and the light blocking member BK. One surface, for example, a bottom surface of the first passivation layer PTL may be in contact with the top surface of each of the plurality of color filters CF1, CF2, and CF3 and the light blocking member BK.

The first passivation layer PTL may include an inorganic insulating material to protect the plurality of color filters CF1, CF2, and CF3 and the light blocking member BK. For example, the first passivation layer PTL may include silicon oxide (SiOx), silicon nitride (SiNx), silicon oxynitride (SiOxNy), aluminum oxide (AlxOy), aluminum nitride (AlN), and/or the like, but is not limited thereto. The first passivation layer PTF1 may have a suitable thickness (e.g., a predetermined thickness), for example, in a range of 0.01 μm to 1 μm. However, the present disclosure is not limited thereto.

Figure 9:
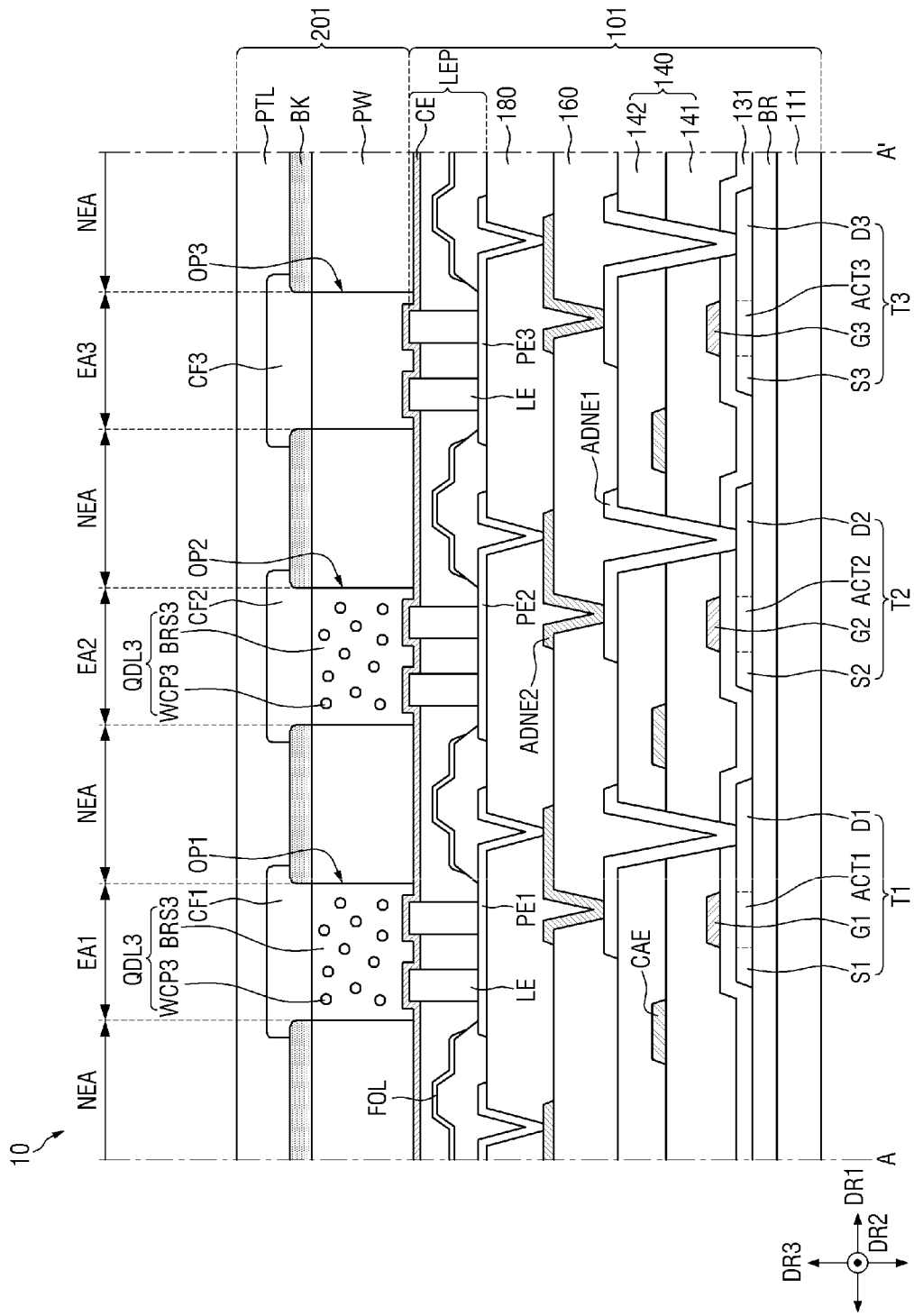
FIG. 9 is a cross-sectional view schematically illustrating a cross section taken along the line A-A' of FIG. 2 according to one or more embodiments.

FIG. 9 is a cross-sectional view schematically illustrating a cross section taken along the line A-A' of FIG. 2 according to one or more embodiments.

Referring to FIG. 9, a third wavelength conversion layer QDL3 may be disposed in each of the first and second opening holes OP1 and OP2.

The third wavelength conversion layer QDL3 may emit light by converting or shifting the peak wavelength of incident light to another specific peak wavelength. The third wavelength conversion layer QDL3 may convert a part of the first blue light emitted from the light emitting element LE into the fourth yellow light. In the third wavelength conversion layer QDL3, the first light and the fourth light may be mixed to emit the fifth white light. The fifth light is converted into the first light through the first color filter CF1 and is converted into the second light through the second color filter CF2.

The third wavelength conversion layer QDL3 may be disposed in each of the first and second opening holes OP1 and OP2, and may be spaced from each other. That is, the third wavelength conversion layer QDL3 may be formed of an island pattern in a shape of dots spaced from each other. For example, the third wavelength conversion layer QDL3 may be disposed only in each of the first opening hole OP1 and the second opening hole OP2, in a one-to-one correspondence. In addition, the third wavelength conversion layer QDL3 may be disposed to overlap each of the first emission area EA1 and the second emission area EA2. In one or more embodiments, each of the third wavelength conversion layers QDL3 may completely overlap the first emission area EA1 and the second emission area EA2.

The third wavelength conversion layer QDL3 may include a third base resin BRS3 and third wavelength conversion particles WCP3. The third base resin BRS3 may contain a light-transmissive organic material. For example, the third base resin BRS3 may contain epoxy resin, acrylic resin, cardo resin, or imide resin.

The third wavelength conversion particle WCP3 may convert the first light incident from the light emitting element LE into the fourth light. For example, the third wavelength conversion particle WCP3 may convert light of a blue wavelength band into light of a yellow wavelength band. The third wavelength conversion particle WCP3 may be a quantum dot (QD), a quantum rod, a fluorescent material, or a phosphorescent material. For example, a quantum dot may be a particulate material that emits light of a specific color when an electron transitions from a conduction band to a valence band.

As the thickness of the third wavelength conversion layer QDL3 increases in the third direction DR3, the content of the third wavelength conversion particles WCP3 included in the wavelength conversion layer QDL increases, so that the light conversion efficiency of the third wavelength conversion layer QDL3 may increase. Accordingly, the thickness of the third wavelength conversion layer QDL3 is preferably set in consideration of the light conversion efficiency of the third wavelength conversion layer QDL3.

In the above-described third wavelength conversion layer QDL3, a part of the first light emitted from the light emitting element LE may be converted into fourth light in the third wavelength conversion layer QDL3. The third wavelength conversion layer QDL3 may emit white fifth light by mixing the first light and the fourth light. For the fifth light emitted from the third wavelength conversion layer QDL3, the first color filter CF1 to be described later may transmit only the first light, and the second color filter CF2 may transmit only the second light. Accordingly, the light emitted from the wavelength conversion member 201 may be the red and green light of the first light and the second light. In the third emission area EA3, only a transparent light-transmissive organic material may be formed in the third opening hole OP3 so that the blue light emitted from the light emitting element LE may be emitted through the third color filter CF3 as it is. Accordingly, full colors may be produced.

Figure 10:
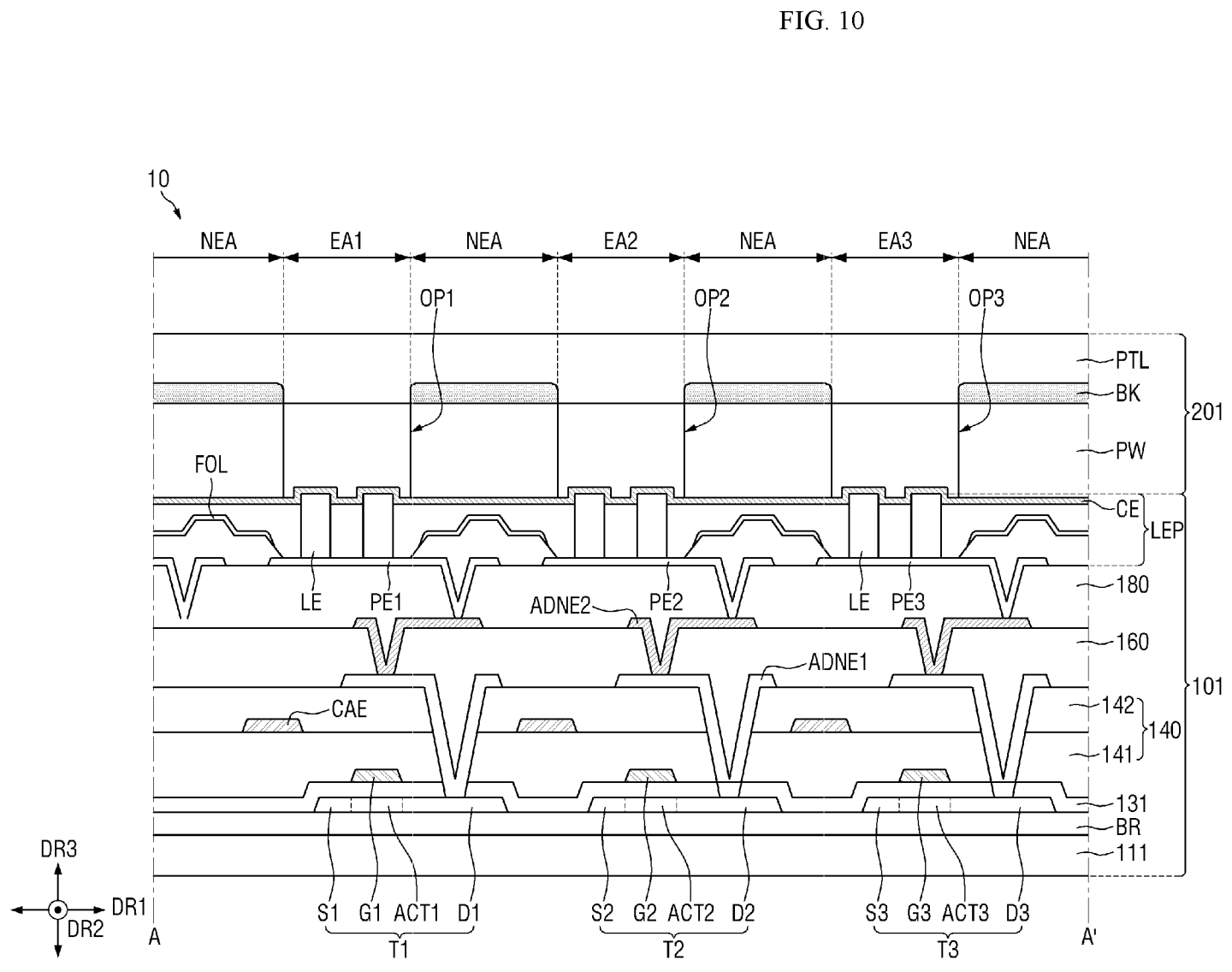

FIG. 10 is a cross-sectional view schematically illustrating a cross section taken along the line A-A' of FIG. 2 according to one or more embodiments.

As described above, the color of the light emitted from the active layer MQW of each light emitting element LE may vary according to the content of indium (In). As the content of indium (In) increases or becomes higher, the wavelength band of light emitted by the active layer may shift to a red wavelength band, and as the content of indium (In) decreases or becomes lower, the wavelength band of light emitted by the active layer may shift to a blue wavelength band. Accordingly, when the content of indium (In) in the active layer MQW of each light emitting element LE formed in the first emission area EA1 is 25% or more, a first light in a red wavelength band with the main peak wavelength in a range of approximately 600 nm to 750 nm may be emitted.

When the content of indium (In) in the active layer MQW of each light emitting element LE formed in the second emission area EA2 is 25%, a second light in a green wavelength band with the main peak wavelength in a range of approximately 480 nm to 560 nm may be emitted.

When the content of indium (In) in the active layer MQW of each light emitting element LE formed in the third emission area EA3 is 15% or less, the active layer MQW may emit a third light in a blue wavelength band with the main peak wavelength in a range of approximately 370 nm to 460 nm.

Each light emitting element LE formed in the first emission area EA1 may emit a first light of a red wavelength band, each light emitting element LE formed in the second emission area EA2 may emit a second light of a green wavelength band, and each light emitting element LE formed in the third emission area EA3 may emit a third light of a blue wavelength band. In this case, the color filters CF1, CF2, and CF3 may not be formed.

Figure 11:
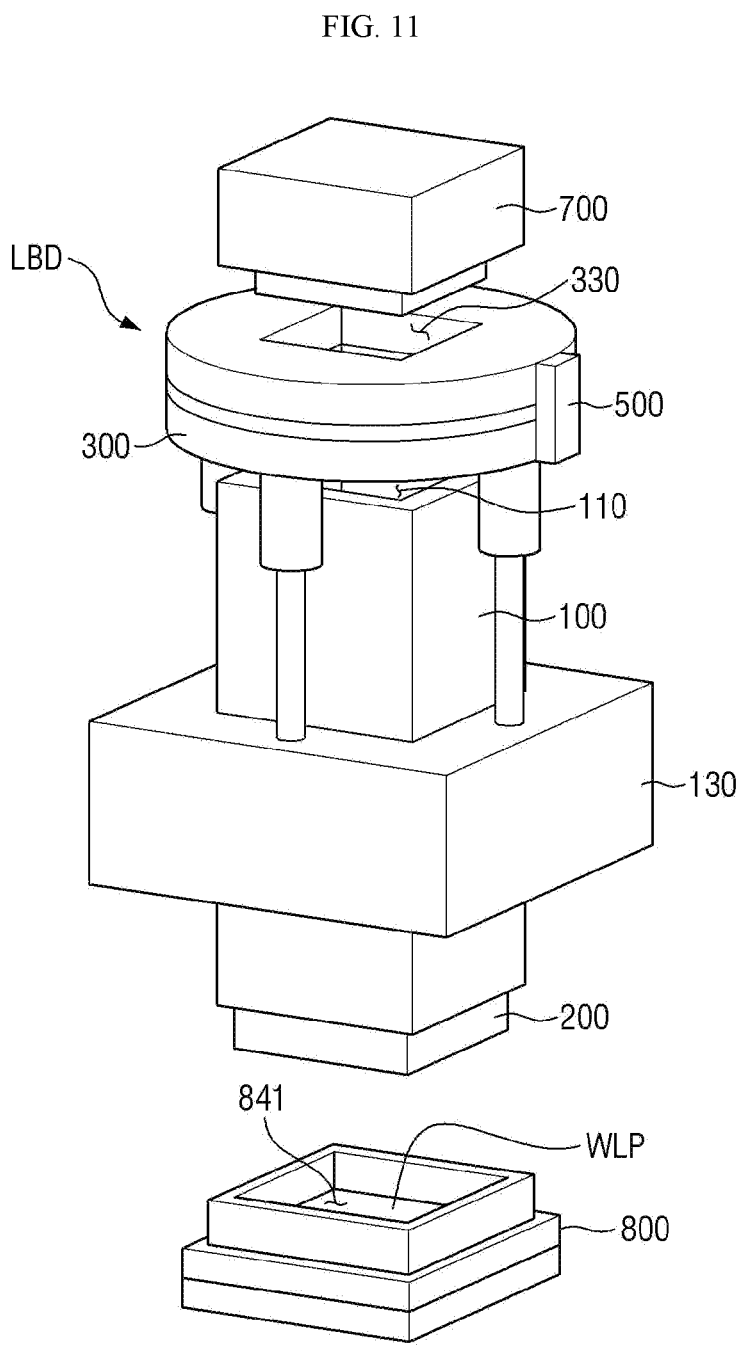

FIG. 11 is a perspective view schematically illustrating an apparatus for fabricating a display panel according to one or more embodiments.

Referring to FIG. 11, an apparatus for fabricating a display panel includes a loading module 800 and an element transfer module LBD.

The loading module 800 is formed in a polygonal flat plate shape such as a square shape, a rectangular shape, or the like, and a support frame for supporting a large-area fabricating substrate or a wafer WLP is disposed on the front surface portion of the flat plate. The flat plate of the loading module 800 may be formed in a flat plate shape such as a circular shape, an elliptical shape, or the like according to the shape of a large-area fabricating substrate LFP or a wafer WLP (see FIG. 21). Further, the support frame of the loading module 800 that supports the outer surface (e.g., the outer peripheral or circumferential surface) of the large-area fabricating substrate or the wafer WLP may also be formed in a circular shape, an elliptical shape, or the like according to the shape of the outer surface (e.g., the outer peripheral or circumferential surface) of the large-area fabricating substrate LFP or the wafer WLP. Hereinafter, an example in which the flat plate and the support frame of the loading module 800 are formed in a rectangular shape will be described.

The support frame of the loading module 800 may be formed in a shape surrounding the loading surface of the flat plate from the side surface, that is, a sidewall frame type having a first opening 841 corresponding to the loading surface of the flat plate and surrounding the outer surface (e.g., the outer peripheral or circumferential surface) of the loading surface of the flat plate from the side surface. Accordingly, a large-area fabricating substrate that is fabricated and separated into a plurality of display panels may be loaded on the loading surface of the flat plate corresponding to the inside of the first opening 841 of the support frame.

In one or more embodiments, an elastic film layer may be disposed on the loading surface of the flat plate, and the rear surface of the large-area fabricating substrate LFP may be pressed with the elastic film layer by an air pressure applied to the rear surface of the elastic film layer through the flat plate.

When the large-area fabricating substrate LFP is loaded on the loading surface of the flat plate on which the elastic film layer is disposed, the wafer WLP on which the plurality of light emitting elements LE, at least one light emitting chip, or a circuit chip such as a microprocessor are disposed may be additionally disposed on the front surface of the large-area fabricating substrate.

When the large-area fabricating substrate LFP is loaded on the loading surface of the flat plate, the loading module 800 may apply heat to the rear surface of the large-area fabricating substrate LFP. To this end, the loading module 800 may include a heating member or may be directly connected to the heating member.

The element transfer module LBD is disposed toward the front surface of the loading module 800 while facing the loading module 800. The element transfer module LBD may press the rear surface of the wafer WLP in a state where the large-area fabricating substrate LFP and the wafer WLP are disposed to face each other inside the first opening 841 of the support frame, that is, on the loading surface of the flat plate. Accordingly, the element transfer module LBD may transfer the plurality of light emitting elements LE formed on the wafer WLP onto the large-area fabricating substrate LFP. Further, the element transfer module LBD may irradiate laser light toward the front surface of the large-area fabricating substrate LFP and the rear surface of the wafer WLP in a state where the plurality of light emitting elements LE are transferred, so that the plurality of light emitting elements LE may be adhered to the large-area fabricating substrate LFP. For another example, in a state where light emitting chips or circuit chips such as microprocessors or the like are arranged on the wafer WLP, the element transfer module LBD may press the rear surface of the wafer WLP to transfer the light emitting chips or the circuit chips onto the large-area fabricating substrate LFP.

Hereinafter, the specific structures of the element transfer module LBD and the loading module 800 will be described in more detail with reference to the accompanying drawings.

Figure 12:
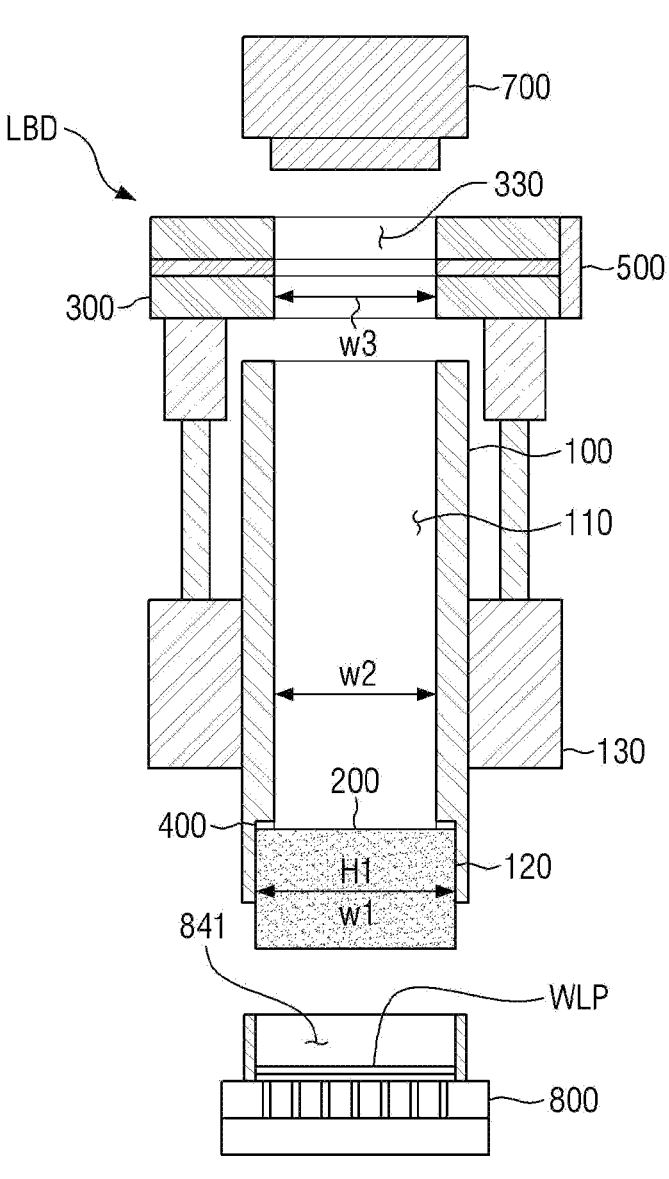
FIG. 12 is a cross-sectional view showing cross-sectional structures of the element transfer module and the loading module shown in FIG. 11.

FIG. 12 is a cross-sectional view showing cross-sectional structures of the element transfer module and the loading module shown in FIG. 11.

Referring to FIGS. 11 and 12, first, the element transfer module LBD includes a transfer member 100, a pressing header 200, a fixing frame 130, a transfer driving member 300, a pressure sensing module 400, an inclination setting module 500, and a laser irradiation member 700.

The transfer member 100 is formed in a polygonal tubular shape or a cylindrical shape having a second opening 110 formed in a polygonal shape such as a quadrilateral shape, or a circular shape, and the pressing header 200 is coupled and fixed to a fixing part 120 formed in the pressing direction in which the transfer member 100 moves. Hereinafter, an example in which the transfer member 100 is formed in a quadrilateral tubular shape having the quadrilateral second opening 110 will be described. Further, the transfer member 100 may be disposed in a vertical direction from the ground, and a downward direction toward the ground may be the pressing direction of the transfer member 100. Alternatively, an upward direction opposite to the ground may be the detaching direction of the transfer member 100.

The fixing part 120 into which the pressing header 200 is inserted and fixed is formed at one end of the transfer member 100 disposed in the downward pressing direction. An insertion hole H1 into which the pressing header 200 is inserted and fixed may be formed in the fixing part 120 of the transfer member 100, and the insertion hole H1 may be formed as a polygonal hole such as a quadrilateral hole, or a cylindrical hole according to the shape of the outer surface (e.g., the outer peripheral or circumferential surface) of the pressing header 200. Accordingly, the upper surface of the pressing header 200 and the outer surface (e.g., the outer peripheral or circumferential surface) of the pressing header 200 in the lateral direction may be inserted into and fixed to the insertion hole H1 formed in the fixing part 120 of the transfer member 100.

As shown in FIG. 12, an inner diameter w1 of the insertion hole H1 into which the pressing header 200 is inserted may be formed to be wider than an inner diameter w2 of the second opening 110 itself of the transfer member 100. In other words, the inner width or diameter w1 of the insertion hole H1 may be formed to be wider or greater than the inner width or diameter w2 of the second opening 110 of the transfer member 100. Accordingly, a stepped portion is formed inside the fixing part 120 due to the difference in inner diameter between the second opening 110 of the transfer member 100 and the insertion hole H1.

The pressure sensing module 400 may be disposed at the inner stepped portion of the fixing part 120. The pressure sensing module 400 may be formed in a quadrilateral ring shape or an O-ring shape corresponding to the shape and area of the inner stepped portion of the fixing part 120. Alternatively, the pressure sensing module 400 may be separated into pieces, and the multiple pieces may be separately disposed on the inner stepped surface of the fixing part 120. The pressing header 200 may be inserted into and fixed to the insertion hole of the fixing part 120 in a state where the pressure sensing module 400 is disposed at the inner stepped portion of the fixing part 120.

The pressing header 200 is formed of a transparent member such as light-transmitting quartz or glass, and is inserted into and fixed to the insertion hole H1 formed in the fixing part 120 of the transfer member 100. In particular, the transparent pressing header 200 may be formed in a hexahedral shape, a regular cube shape, a cylindrical shape, or a columnar shape corresponding to the shape and size of the insertion hole H1 formed in the fixing part 120 of the transfer member 100. As shown in FIG. 12, the width or diameter of the pressing header 200 is the same as or corresponds to the inner width or diameter w2 of the insertion hole H1, so that the pressing header 200 is inserted into and fixed to the insertion hole H1.

The pressing header 200 may move in the pressing direction that is the downward direction, or may move in the detaching direction that is the upward direction, similarly to the transfer member 100, while being inserted into the fixing part 120 of the transfer member 100. For example, the pressing header 200 made of a transparent material may move in the pressing direction similarly to the transfer member 100 and press the wafer WLP of the loading module 800 disposed in the pressing direction. The laser light applied in the downward direction that is the pressing direction from the upward direction that is the rear surface direction may pass through the pressing header 200 made of a transparent material and may be emitted.

The fixing frame 130 may be attached or assembled to the outer surface of the transfer member 100, or may be integrally formed with the transfer member 100. The fixing frame 130 is formed to protrude from the outer surface of the transfer member 100. The fixing frame 130 may protrude in a quadrilateral shape or a hemispherical shape while surrounding the outer surface of the transfer member 100. The rear or outer surface of the fixing frame 130 is coupled to the transfer driving member 300. The pressing header 200 and the transfer member 100 as well as the fixing frame 130 are moved in the downward pressing direction or the upward detaching direction by the driving of the transfer driving member 300.

The transfer driving member 300 includes a flat plate type support frame and a plurality of pneumatic or hydraulic pressure controllers coupled to the flat plate type support frame. The transfer driving member 300 moves the pressing header 200 and the transfer member 100 as well as the fixing frame 130 using the plurality of pressure controllers. The plurality of pressure controllers are disposed under the flat pate type support frame. The lengths of the plurality of pressure controllers are adjusted according to changes in the amount of inner pneumatic pressure or hydraulic pressure. The transfer driving member 300 may move the pressing header 200 and the transfer member 100 as well as the fixing frame 130 in the downward pressing direction or in the upward direction that is the opposite direction thereof by changing the length of each pressure controller.

A third opening 330 corresponding to the second opening 110 of the transfer member 100 is formed in the flat plate type support frame of the transfer driving member 300. The third opening 330 formed in the transfer driving member 300 and the second opening 110 of the transfer member 100 may correspond to each other and have the same shape and hole area. The shape and size of the third opening 330 of the transfer driving member 300 may correspond to the shape and size of the second opening 110 of the transfer member 100, so that a width or diameter w3 of the third opening 330 may be the same as the width or diameter w2 of the second opening 110.

The pressure sensing module 400 is disposed on the stepped surface formed inside the transfer member 100. The pressure sensing module 400 may be formed in a quadrilateral ring or an O-ring shape corresponding to the shape and area of the inner stepped portion of the fixing part 120. The pressure sensing module 400 may be provided in the form of multiple pieces separately disposed on the stepped surface inside the transfer member 100.

The pressure sensing module 400 includes a plurality of pressure sensors and at least one signal transmission circuit. The pressure sensing module 400 detects the magnitude of pressure applied to the pressing header 200 using the plurality of pressure sensors, and generates pressure detection signals based on the magnitude of pressure applied to the pressing header 200. The pressure sensing module 400 may transmit the pressure detection signals to the inclination setting module 500 using the signal transmission circuit.

The inclination setting module 500 compares and analyzes the magnitudes of the pressure detection signals of the pressure sensing module 400 to detect the horizontal inclination of the pressing header 200. Further, the pressing force control values for controlling the bonding pressing force of the loading module 800 are calculated according to the horizontal inclination of the pressing header 200. For example, the inclination setting module 500 may detect the magnitude deviation of the pressure detection signals detected by the pressure sensing module 400, and may calculate the pressing force control values of the loading module 800 that are required to make the magnitude deviation of the pressure detection signals zero. That is, it is possible to calculate the pressing force control values for controlling the bonding pressing force of the loading module 800 that are required to make the magnitude deviation of the pressure detection signals zero. The inclination setting module 500 transmits the pressing force control values to the loading module 800 in a wired or wireless manner together with position codes of the pressure sensors that have detected the pressure detection signals.

The laser irradiation member 700 is disposed toward the rear surface of the transfer driving member 300, for example, above the transfer driving member 300, and irradiates laser light toward the third opening 330 of the transfer driving member 300. The laser light penetrating the third opening 330 of the transfer driving member 300 and the second opening 110 of the transfer member 100 is emitted toward the front surface of the pressing header 200 through the pressing header 200.

Figure 13:
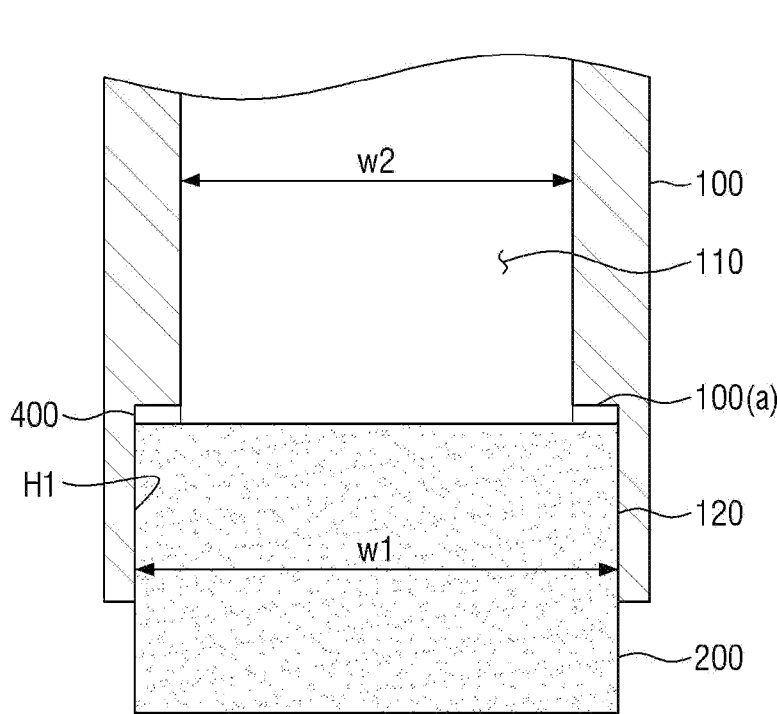
FIG. 13 is a cross-sectional view showing the cross-sectional structure of the transfer member and the fixing part of the transfer member shown in FIG. 12.

FIG. 13 is a cross-sectional view showing the cross-sectional structure of the transfer member and the fixing part of the transfer member shown in FIG. 12.

Referring to FIG. 13, the inner diameter w1 of the fixing part 120 of the transfer member 100 into which the pressing header 200 is inserted, that is, the inner diameter w1 of the insertion hole H1 formed inside the fixing part 120, is formed to be wider than the inner diameter w2 of the second opening 110 penetrating the inside of the transfer member 100. Accordingly, a stepped portion 100(*a*) caused by the difference in inner diameters between the second opening 110 of the transfer member 100 and the insertion hole H1 of the pressing header 200 is formed inside the fixing part 120. The pressure sensing module 400 of a quadrilateral ring type or an O-ring type is disposed at the inner stepped portion 100(*a*) of the insertion hole H1. As described above, the pressure sensing module 400 may be separated into pieces, and the multiple pieces may be separately disposed on the surface of the inner stepped portion 100(*a*) of the insertion hole.

In a state where the pressure sensing module 400 is disposed on the surface of the inner stepped portion 100(*a*) of the insertion hole H1, the pressing header 200 is inserted into and fixed to the insertion hole H1 to be in contact with the pressure sensing module 400. The pressing header 200 may move in the pressing direction that is the downward direction, similarly to the transfer member 100, while being inserted into the insertion hole H1 of the fixing part 120 to press the wafer WLP of the loading module 800.

Figure 14:
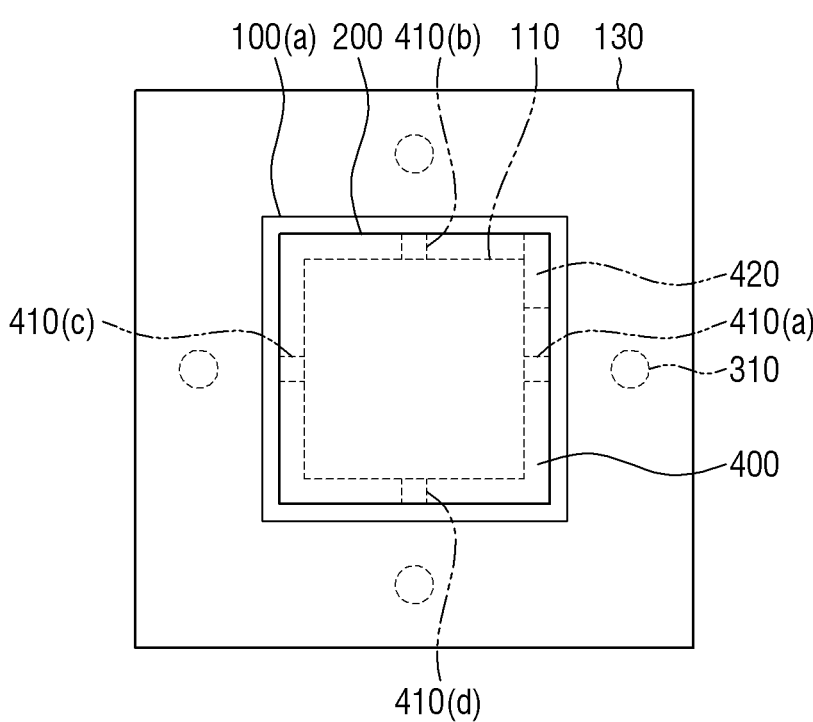
FIG. 14 is a configuration diagram showing the bottom surfaces of the pressing header, the transfer member, and the fixing frame of FIGS. 12 and 13 when viewed in the upward direction.

FIG. 14 is a configuration diagram showing the bottom surfaces of the pressing header, the transfer member, and the fixing frame of FIGS. 12 and 13 when viewed in the upward direction.

Referring to FIG. 14, the pressure controllers 310 of the transfer driving member 300 are coupled to the rear surface of the fixing frame 130, so that the pressing header 200 and the transfer member 100 as well as the fixing frame 130 may be moved in the vertical direction by the pressure controllers 310.

The pressure controllers 310 of the transfer driving member 300 may be respectively coupled in the 2-axis, 3-axis, or 4-axis directions of the fixing frame 130. For example, four pressure controllers 310 may be respectively coupled in 4-axis directions of the side or rear surface of the fixing frame 130, that is, the x-axis, −x-axis, y-axis, and −y-axis directions. The lengths of the four pressure controllers 310 may be adjusted in the vertical direction (or forward-backward direction), and the pressing header 200 and the transfer member 100 as well as the fixing frame 130 may be moved in the vertical direction (or forward-backward direction) in response to changes in the lengths of the pressure controllers 310.

Because the inner diameter w1 of the insertion hole H1 to which the pressing header 200 is fixed is formed to be wider than the inner diameter w2 of the second opening 110 penetrating the inside of the transfer member 100, the quadrilateral ring-type pressure sensing module 400 may be disposed at the inner stepped portion 100(*a*) of the insertion hole H1.

Referring to FIG. 14, the quadrilateral ring-type pressure sensing module 400 includes a plurality of pressure sensors 410, and at least one signal transmission circuit 420.

The plurality of pressure sensors 410 are respectively disposed at positions in different directions to detect the pressure applied from the pressing header 200 and generate a pressure detection signal according to the magnitude of the detected pressure.

The plurality of pressure sensors 410 may be respectively disposed in 4-axis directions of the insertion hole H1 to which the pressing header 200 is fixed. For example, the plurality of pressure sensors 410 may be respectively disposed in the x-axis, −x-axis, y-axis, and −y-axis directions corresponding to the coupling positions of the pressure controllers 310 coupled to the fixing frame 130. For example, from among the plurality of pressure sensors 410, a first pressure sensor 410(*a*) may be disposed in the x-axis direction of the insertion hole H1, and a second pressure sensor 410(*b*) may be disposed in the y-axis direction of the insertion hole H1. In addition, a third pressure sensor 410(*c*) may be disposed in the −x-axis direction of the insertion hole H1, and a fourth pressure sensor 410(*d*) may be disposed in the −y-axis direction of the insertion hole H1.

The plurality of pressure sensors 410, for example, the first to fourth pressure sensors 410(*a*) to 410(*d*) may be evenly distributed to be symmetrical or correspond to each other in different directions. As shown in FIG. 14, the first to fourth pressure sensors 410(*a*) to 410(*d*) may be respectively disposed at the central positions of four surfaces of the quadrilateral insertion hole H1. For another example, when the plurality of pressure sensors 410 are disposed on each surface, the distances between the pressure sensors 410 may be the same. The pressure sensors 410 disposed on the respective surfaces may be arranged to be symmetrical in the upward, downward, left, and right directions or in the x-axis, −x-axis, y-axis, and −y-axis directions.

In addition, the number and arrangement positions of the plurality of pressure sensors 410 are not limited to those illustrated in FIG. 14, and two or more pressure sensors 410 may be disposed in two or more axial directions to be disposed in an axial direction of a polygon such as a straight line, a triangle, a quadrangle, a pentagon, a hexagon, or the like. Alternatively, the plurality of pressure sensors 410 may be arranged in a polygonal shape such as a triangle, a quadrangle, a pentagon, a hexagon, or the like.

At least one signal transmission circuit 420 transmits the pressure detection signals generated by the plurality of pressure sensors 410 to the inclination setting module 500.

At least one signal transmission circuit 420 receives the pressure detection signals from the plurality of pressure sensors 410 in real time, and transmits the pressure detection signals according to the pressure magnitude to the inclination setting module 500 together with the position code for each pressure sensor 410. To this end, at least one signal transmission circuit 420 may further include a short-range interface communication circuit for transmitting pressure detection signals in a wired or wireless manner.

Figure 15:
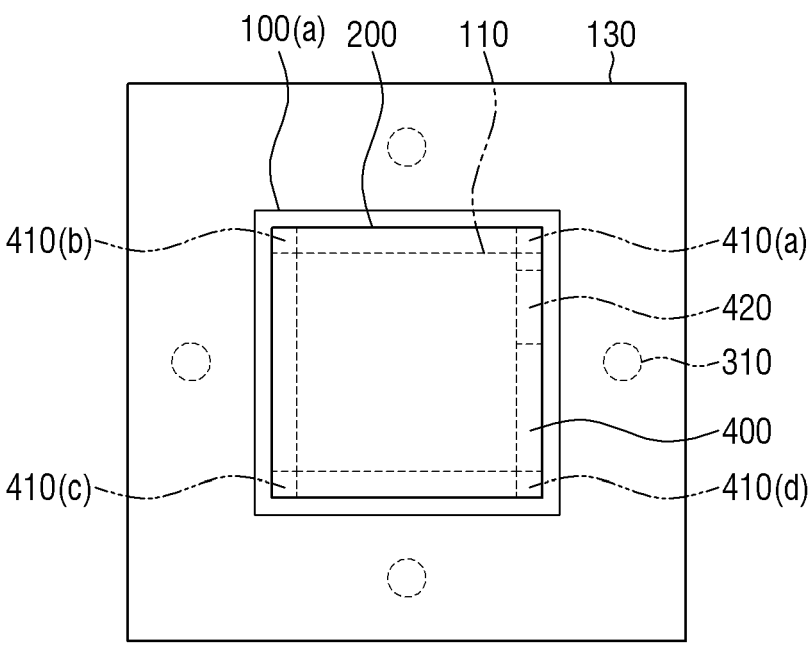
FIG. 15 is a configuration diagram of one or more embodiments showing the bottom surfaces of the pressing header, the transfer member, and the fixing frame of FIGS. 12 and 13 when viewed in the upward direction.

FIG. 15 is a configuration diagram of an embodiment showing the bottom surfaces of the pressing header, the transfer member, and the fixing frame of FIGS. 12 and 13 when viewed in the upward direction.

Referring to FIG. 15, the plurality of pressure sensors 410 may be disposed at corner positions of the inner stepped portion 100(*a*) according to the shape of the inner stepped portion 100(*a*) and the insertion hole H1 to which the pressing header 200 is fixed. For example, the plurality of pressure sensors 410 may be respectively disposed at four direction corner positions of the inner stepped portion 100(*a*) formed in a quadrilateral shape. In other words, from among the plurality of pressure sensors 410, the first pressure sensor 410(*a*) may be disposed at a first direction corner position of the inner stepped portion 100(*a*), and the second pressure sensor 410(*b*) may be disposed at a second direction corner position of the inner stepped portion 100(*a*). Further, the third pressure sensor 410(*c*) may be disposed at a third direction corner position of the inner stepped portion 100(*a*), and the fourth pressure sensor 410(*d*) may be disposed at a fourth direction corner position of the inner stepped portion 100(*a*).

The number and arrangement positions of the plurality of pressure sensors 410 are not limited to those illustrated in FIG. 15, and two or more pressure sensors 410 may be arranged in a polygonal shape such as a triangle, a quadrangle, a pentagon, a hexagon, or the like. The pressure sensors 410 may be arranged in a polygonal shape such that the same gap is maintained therebetween.

At least one signal transmission circuit 420 is disposed at a position adjacent to any one pressure sensor 410 and receives pressure detection signals from each pressure sensor 410. For example, the signal transmission circuit 420 is electrically connected to the pressure sensors 410 through wires formed inside the quadrilateral ring-type pressure sensing module 400 or wires formed at the inner stepped portion 100(*a*) of the insertion hole H1. The signal transmission circuit 420 receives the pressure detection signals from the plurality of pressure sensors 410 in real time, and transmits the pressure detection signals according to the pressure magnitude to the inclination setting module 500 together with a directional position code for each pressure sensor 410. To this end, at least one signal transmission circuit 420 may further include a short-distance interface communication circuit for transmitting pressure detection signals in a wired or wireless manner.

Figure 16:
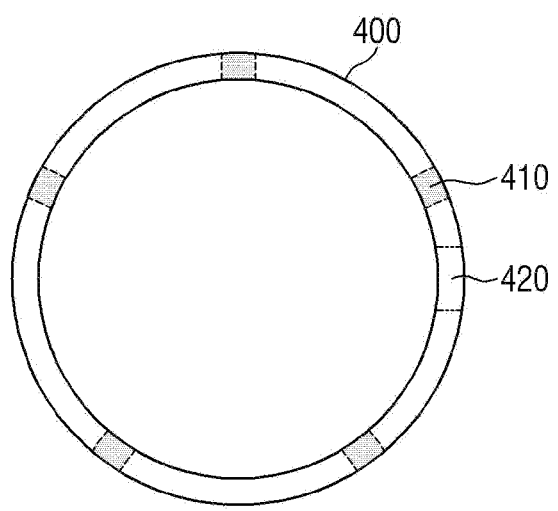
FIG. 16 is a configuration diagram of one or more embodiments showing the arrangement shape of the pressure sensing module shown in FIGS. 14 and 15.

FIG. 16 is a configuration diagram of an embodiment showing the arrangement shape of the pressure sensing module shown in FIGS. 14 and 15. Further, FIG. 17 is a configuration diagram of an embodiment showing the arrangement shape of the pressure sensing module shown in FIGS. 14 and 15.

Figure 17:
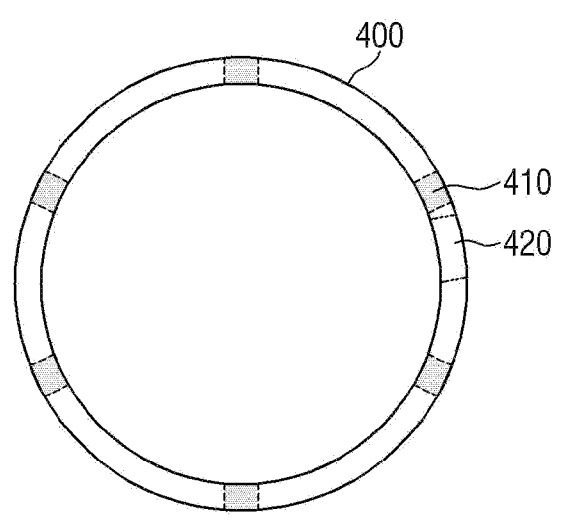
FIG. 17 is a configuration diagram of still one or more embodiments showing the arrangement shape of the pressure sensing module shown in FIGS. 14 and 15.

As shown in FIGS. 16 and 17, the pressure sensing module 400 may be formed in an O-ring shape to correspond to the shape and area of the inner stepped portion of the fixing part 120. The plurality of pressure sensors 410 included in the O-ring type pressure sensing module 400 may be arranged in the axial direction of a polygon such as a pentagon or the like other than a triangle or a quadrangle.

For example, the pressure controllers 310 of the transfer driving member 300 may be arranged and coupled to the rear surface of the fixing frame 130 in the axial direction of a polygon such as a pentagon, a hexagon, or the like other than a triangle or a quadrangle. Accordingly, the plurality of pressure sensors 410 may be arranged in the axial direction of a polygon such as a pentagon, a hexagon, or the like to correspond to the polygonal axial direction of the insertion hole to which the pressing header 200 is fixed.

The plurality of pressure sensors 410 disposed in a circular or polygonal axial direction may be disposed such that the same gap is maintained between adjacent pressure sensors 410. Further, the plurality of pressure sensors 410 disposed in a circular or polygonal axial direction may be disposed such that the distances to the center point of the circular or polygonal shape are equal with respect to the center point thereof. Even in this case, the pressure sensors 410 may be arranged such that the same gap is maintained therebetween.

The plurality of pressure sensors 410 arranged in a circular or polygonal axial direction may be arranged to be symmetrical to each other with respect to the center point of the circular or polygonal shape. Further, the plurality of pressure sensors 410 may be arranged to face each other with respect to the center point of the circular or polygonal shape.

Similarly, at least one signal transmission circuit 420 disposed adjacent to any one pressure sensor 410 transmits the pressure detection signals from the plurality of pressure sensors 410 to the inclination setting module 500 together with an arrangement position code for each pressure sensor 410.

Figure 18:
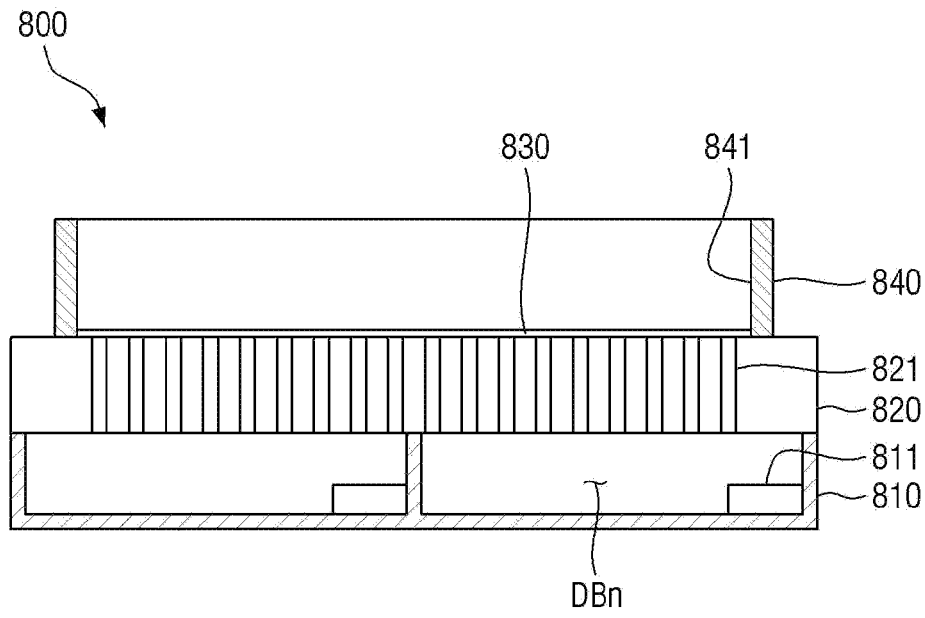
FIG. 18 is a cross-sectional view showing the cross-sectional structure of the loading module illustrated in FIGS. 11 and 12.

FIG. 18 is a cross-sectional view showing the cross-sectional structure of the loading module 800 illustrated in FIGS. 11 and 12. Further, FIG. 19 is an exploded perspective view showing in detail the loading module 800 of FIGS. 11 and 12.

Figure 19:
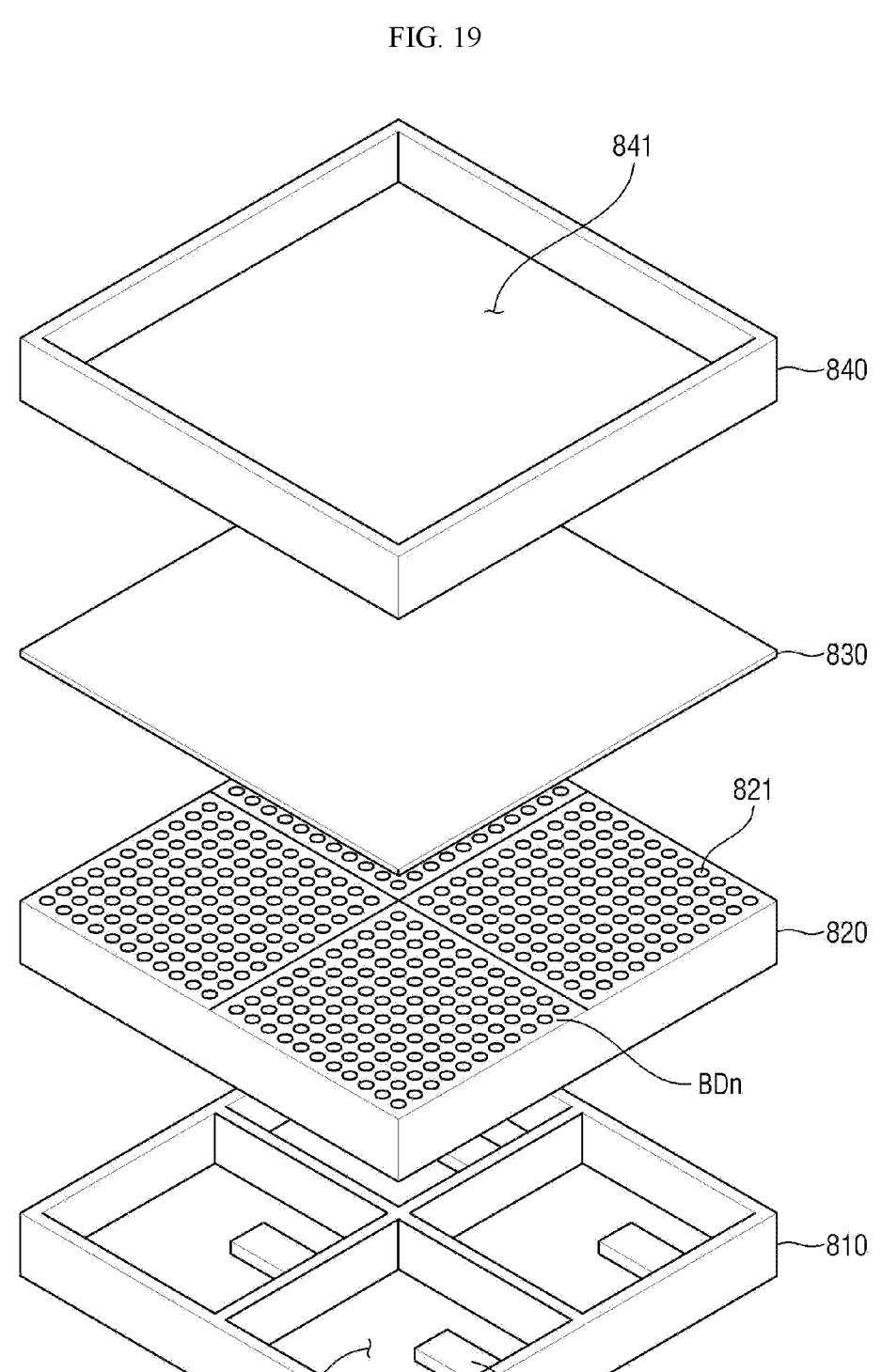
FIG. 19 is an exploded perspective view showing in detail the loading module of FIGS. 11 and 12.

Referring to FIGS. 18 and 19, the loading module 800 includes an air supply stage 810, a flat plate 820, an elastic film layer 830, and a support frame 840.

The flat plate 820 is divided into a plurality of block areas BDn, and a plurality of air holes 821 are formed in each block area BDn. The plurality of air holes 821 are formed through the front and rear surfaces of the flat plate 820. Air generated by the air supply stage 810 from the rear surface of the flat plate 820 is injected toward the front surface of the flat plate 820 through the plurality of air holes 821.

The plurality of block areas BDn may respectively correspond to the arrangement positions or arrangement areas of the pressure sensors 410 formed at the pressure sensing module 400 of the element transfer module LBD. Further, the plurality of block areas BDn may respectively correspond to the arrangement positions or arrangement areas of the pressure controllers 310 formed at the transfer driving member 300 of the element transfer module LBD.

The air supply stage 810 is disposed on the rear surface side of the flat plate 820. Accordingly, the air supplied from the air supply stage 810 is injected toward the front surface of the flat plate 820 through the plurality of air holes 821 formed in the block areas BDn.

The air supply stage 810 includes a plurality of air supply areas DBn respectively corresponding to the plurality of block areas BDn of the flat plate 820.

The air supply stage 810 further includes a plurality of air injectors 811 that generate air according to the pressing force control values and the position codes of the pressure sensors 410 inputted from the inclination setting module 500 of the element transfer module LBD. Here, the plurality of air injectors 811 are respectively disposed in the plurality of air supply areas DBn.

The air injectors 811 disposed in the air supply areas DBn of the air supply stage 810 may be respectively matched with the positions and position codes of the pressure sensors 410 to generate and inject air based on the pressing force control values for each matched position code. In other words, the air injection intensity and injection period of the air injectors 811 may be preset based on the magnitudes of the pressing force control values.

As described above, the inclination setting module 500 of the element transfer module LBD detects the magnitude deviation of the pressure detection signals detected by the pressure sensors 410, and calculates the pressing force control values for controlling the bonding pressing force of the loading module 800 that are required to make the magnitude deviation of the pressure detection signals zero. Accordingly, the air injectors 811 disposed in the air supply areas DBn may selectively generate and inject air to the air supply areas DBn based on the pressing force control values for each matched position code.

The elastic film layer 830 is disposed to cover the front surface of the flat plate 820 or the loading surface of the large-area fabricating substrate. The elastic film layer 830 may be made of an elastic material such as silicon, natural rubber, and/or synthetic rubber, or may be formed of a diaphragm made of an elastic material such as silicon, natural rubber, or synthetic rubber.

The outermost surface of the elastic film layer 830 may be attached to the outermost surface of the flat plate 820 along the front outermost surface of the flat plate 820. Alternatively, the outermost surface of the elastic film layer 830 may be attached to the outermost surface of the loading surface along the loading surface of the large-area fabricating substrate. Accordingly, the elastic film layer 830 may seal the front surface of the flat plate 820 or the loading surface of the large-area fabricating substrate.

The support frame 840 is formed of a sidewall frame type having the first opening 841 corresponding to the loading surface of the flat plate 820 and surrounding the outer surface (e.g., the outer peripheral or circumferential surface) of the loading surface of the flat plate 820 from the side surface. The support frame 840 is disposed on the front surface of the elastic film layer 830 to press the outermost surface of the elastic film layer 830. A large-area fabricating substrate that is fabricated and separated into a plurality of display panels may be loaded on the loading surface of the flat plate 820 corresponding to the inside of the first opening 841 of the support frame 840, that is, on the front surface of the elastic film layer 830.

When the large-area fabricating substrate is loaded on the front surface of the elastic film layer 830, the wafer WLP on which the plurality of light emitting elements LE, at least one light emitting chip, or the circuit chip such as a microprocessor or the like are disposed may be additionally disposed on the front surface of the large-area fabricating substrate.

Figure 20:
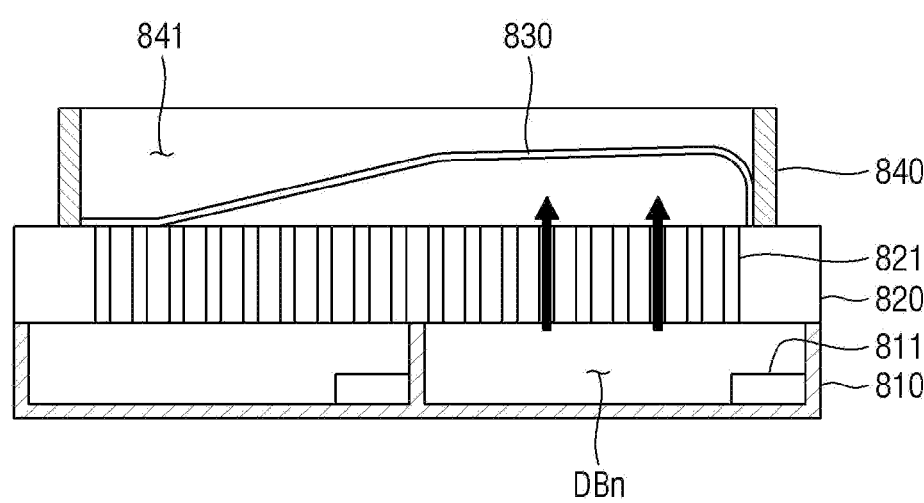
FIG. 20 is a cross-sectional view showing a method of injecting air to an elastic film layer in the air supply area of the air supply stage illustrated in FIG. 19.

FIG. 20 is a cross-sectional view showing a method of injecting air to an elastic film layer in the air supply area of the air supply stage illustrated in FIG. 19.

Referring to FIG. 20, the inclination setting module 500 detects the magnitude deviation of the pressure detection signals detected by the pressure sensing module 400 in real time, and calculates the pressing force control values of the loading module 800 that are required to make the magnitude deviation of the pressure detection signals zero. Further, the inclination setting module 500 transmits the position codes and the pressing force control values to the air injectors 811 matched with the position codes of the pressure sensors 410.

The air injectors 811 disposed in the air supply areas DBn of the air supply stage 810 generate and inject air based on pressing force control values for each position code. As indicated by arrows, the air injectors 811 may selectively generate and inject air based on the inputted pressing force control values. As described above, the air injection intensity and injection period of the air injectors 811 may be preset according to the magnitudes of the pressing force control values.

Figure 21:
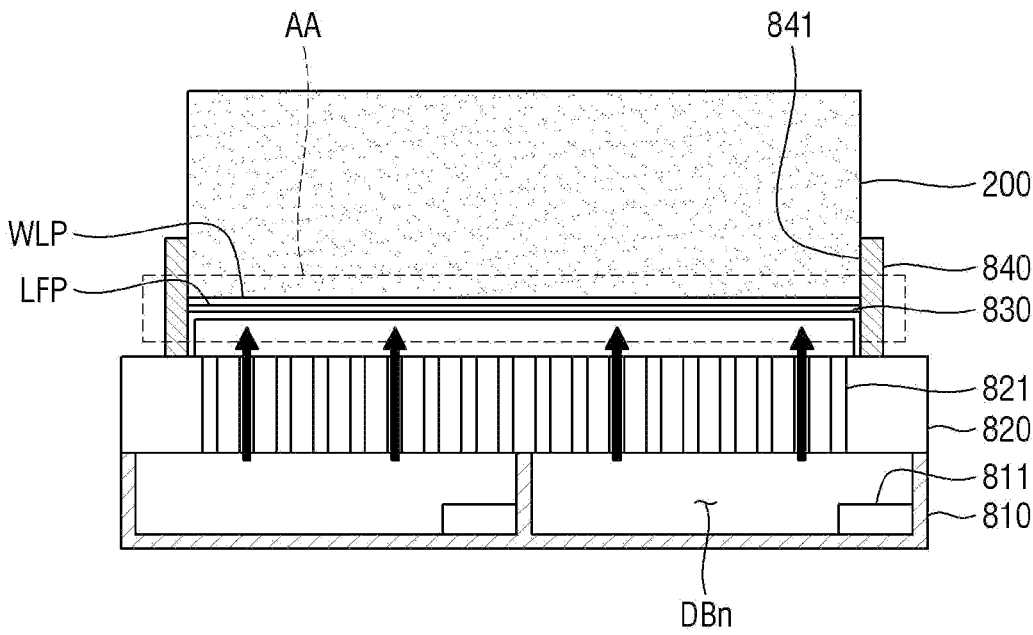
FIG. 21 is a cross-sectional view showing a method of bonding and pressing a fabricating substrate using an air supply stage, a flat plate, and an elastic film layer of a loading module.

FIG. 21 is a cross-sectional view showing a method of bonding and pressing a fabricating substrate using an air supply stage, a flat plate, and an elastic film layer of a loading module. Further, FIG. 22 is a cross-sectional view showing in detail an area AA of FIG. 21.

Figure 22:
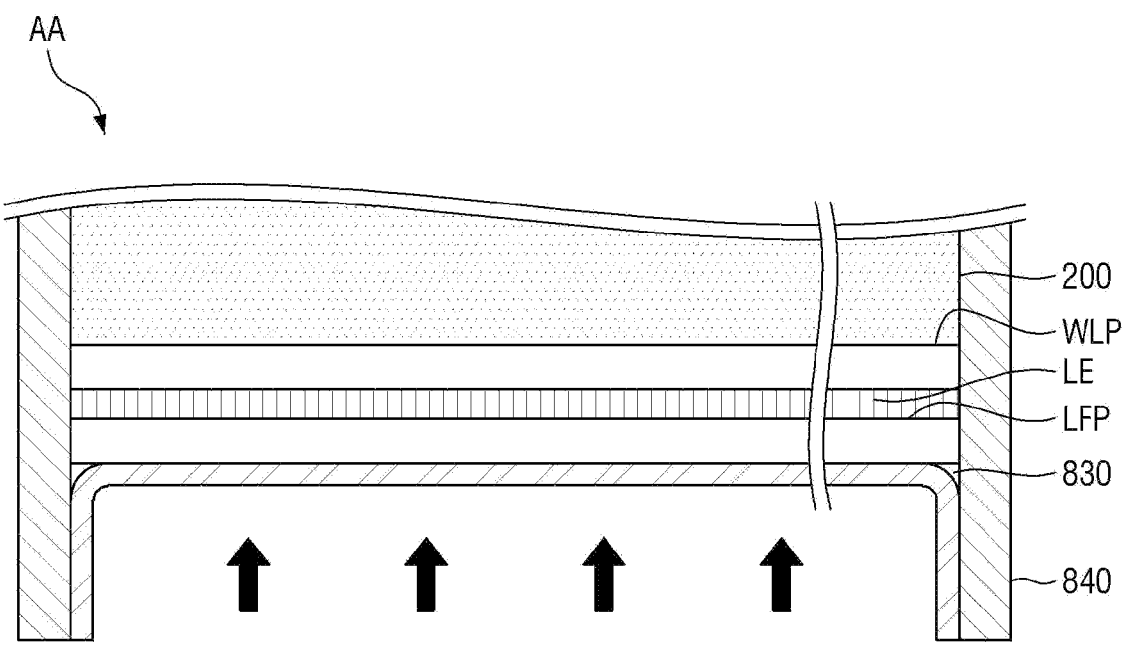
FIG. 22 is a cross-sectional view showing in detail an area AA of FIG. 21.

Referring to FIGS. 21 and 22, when a large-area fabricating substrate LFP is loaded on the front surface of the elastic film layer 830 corresponding to the inside of the first opening 841 of the support frame 840, the wafer WLP on which the plurality of light emitting elements LE are disposed may be additionally disposed on the front surface of the large-area fabricating substrate.

The transfer driving member 300 moves the transfer member 100 and the pressing header 200 to press the rear surface of the wafer WLP using the pressing header 200.

The inclination setting module 500 analyzes the pressure detection signals detected by the pressure sensors 410 in real time to calculate the pressing force control values of the loading module 800. Further, the inclination setting module 500 transmits the respective pressing force control values to the respective air injectors 811 that are matched with the position codes of the pressure sensors 410.

The air injectors 811 disposed in the air supply areas DBn of the air supply stage 810 generate and inject air based on the pressing force control values for each position code. Accordingly, the air injectors 811 may selectively generate and inject air based on the inputted pressing force control values.

As indicated by arrows, air generated by the air injectors 811 for each air supply area DBn from the rear surface of the flat plate 820 is injected toward the front surface of the flat plate 820 through the plurality of air holes 821.

The elastic film layer 830 expands by the air pressure applied to the rear surface of the elastic film layer 830 through the flat plate 820, and the rear surface of the large-area fabricating substrate LFP may be pressed by the expanded elastic film layer 830.

In addition, as shown in FIG. 21, the transfer member 100 and the pressing header 200 are moved downward by the transfer driving member 300, so that the pressing header 200 may press the rear surface of the wafer WLP on which the plurality of light emitting elements LE are formed. The pressing header 200 presses the rear surface of the wafer WLP, so that the plurality of light emitting elements LE formed on the wafer WLP are attached to the large-area fabricating substrate LFP.

Thereafter, the laser irradiation member 700 irradiates laser light toward the opening hole 330 of the transfer driving member 300 and the opening 110 of the transfer member 100. The laser light penetrating the opening hole 330 of the transfer driving member 300 and the opening 110 of the transfer member 100 penetrates the pressing header 200 and is emitted toward the front surface of the pressing header 200. The plurality of light emitting elements LE may be adhered on the large-area fabricating substrate LFP, and the plurality of light emitting elements LE may be heated by laser light and transferred onto the large-area fabricating substrate LFP.

Figure 23:
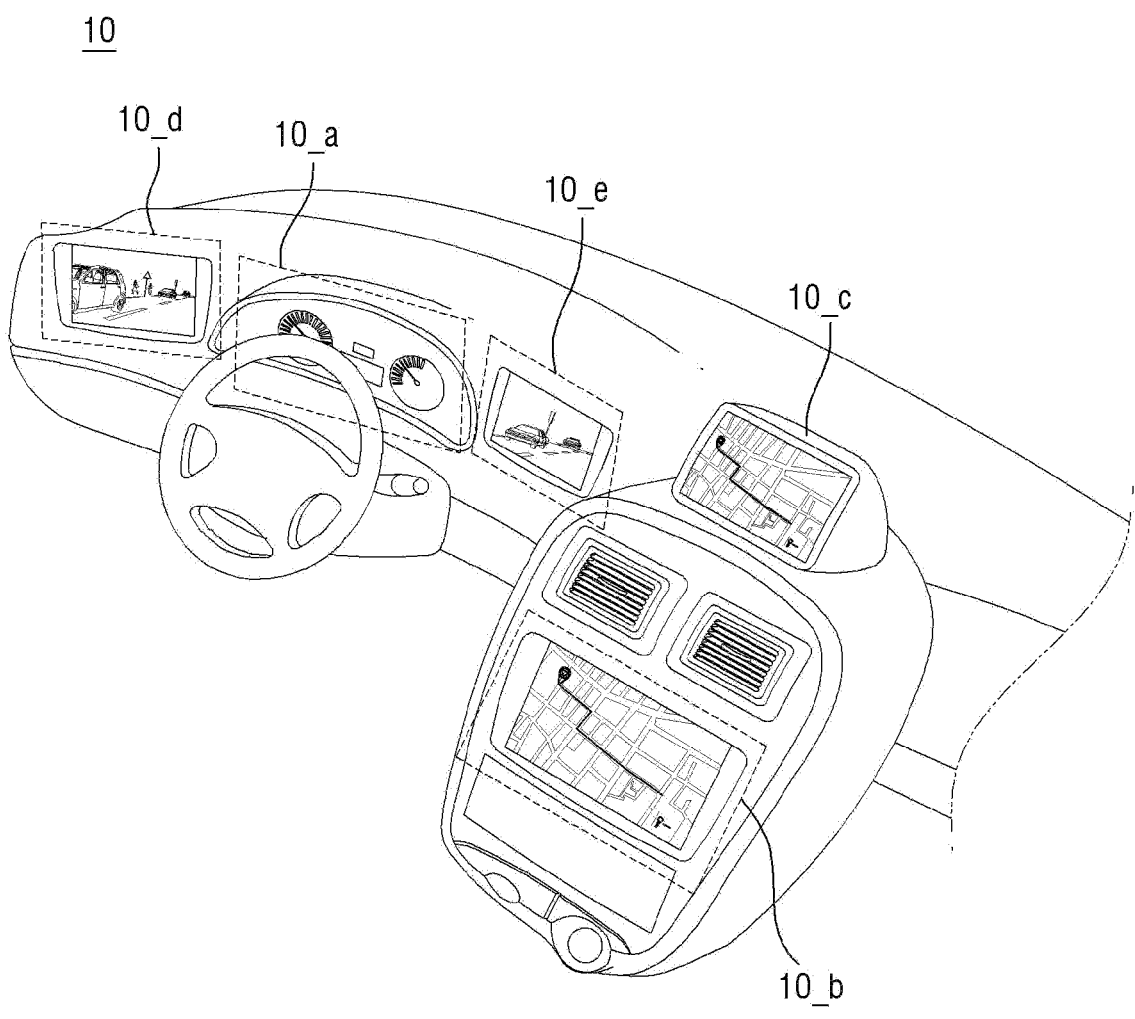
FIG. 23 is a diagram illustrating a vehicle instrument panel and a center fascia including a display device according to one or more embodiments.

FIG. 23 is a diagram illustrating a vehicle instrument panel and a center fascia including a display device according to one or more embodiments.

Referring to FIG. 23, the micro display substrates 101 or the display panel included in the display device of the present disclosure may be applied as the display device 10 or the display device of a vehicle dashboard. For example, the display devices 10 to which the light emitting elements LE such as micro LEDs or the like are applied may be applied to a dashboard 10_a of a vehicle, a center fascia 10_b of a vehicle, or a center information display (CID) 10_c disposed at the dashboard of a vehicle. Further, the display device 10 according to one or more embodiments may be applied to room mirror displays 10_d and 10_e used instead of a side mirror of a vehicle, a navigation device, or the like.

Figure 24:
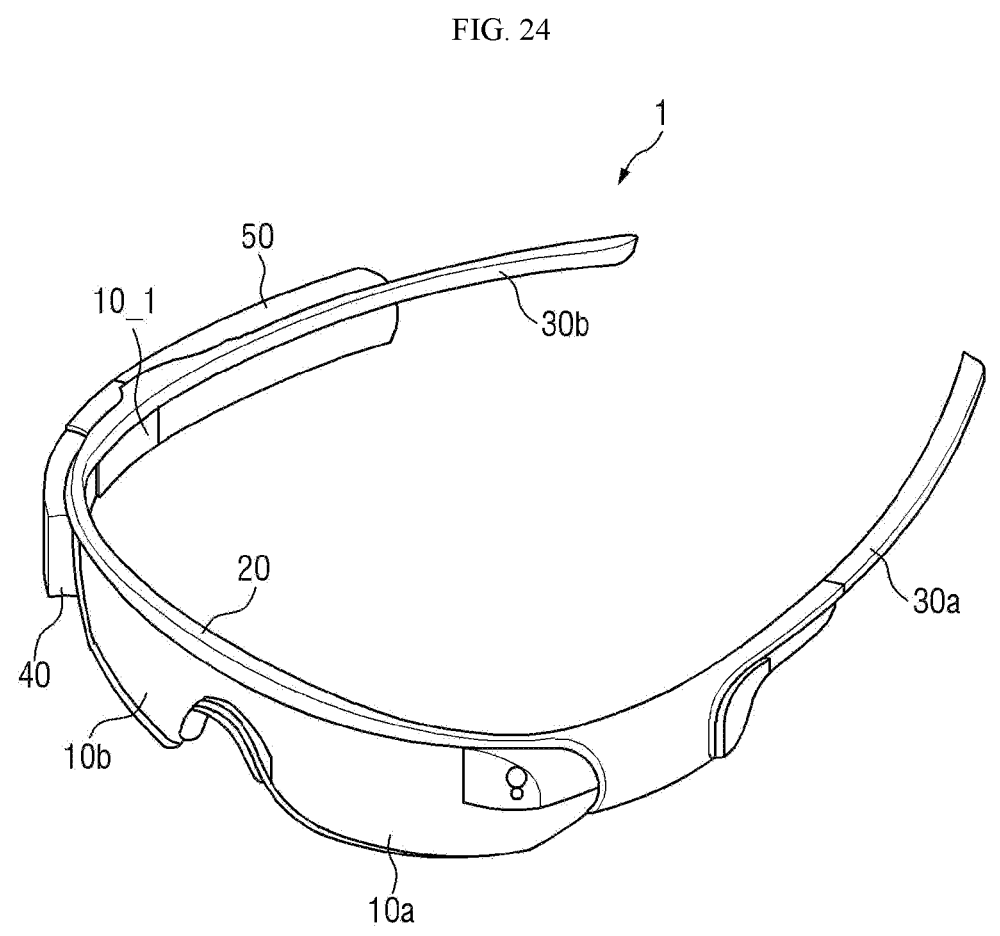
Figure 25:
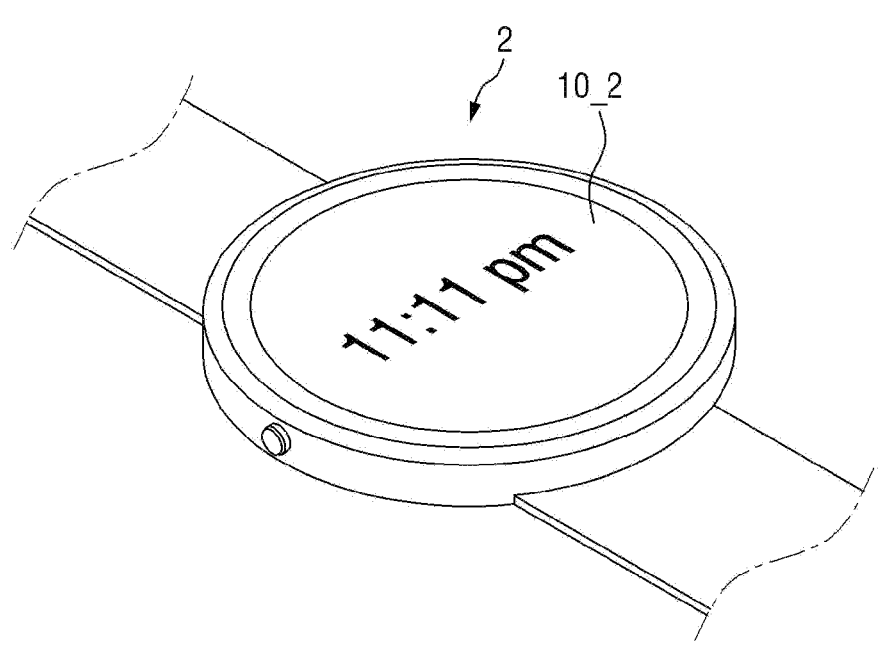
FIG. 25 is a diagram illustrating a watch type smart device including a display device according to one or more embodiments.

FIG. 24 is a diagram illustrating a glasses type virtual reality device including a display device according to one or more embodiments. FIG. 25 is a diagram illustrating a watch type smart device including a display device according to one or more embodiments.

FIG. 24 illustrates the glasses type virtual reality device 1 including temples 30a and 30b. The glasses type virtual reality device 1 according to one or more embodiments may include a virtual image display device 10_1, a left lens 10a, a right lens 10b, a support frame 20, the temples 30a and 30b, a reflection member 40, and a display device storage 50. The virtual image display device 10_1 may display a virtual image using the micro display substrates 101 illustrated in the embodiment of the present disclosure.

The glasses type virtual reality device 1 according to one or more embodiments may be applied to a head mounted display including a head mounted band that may be worn on a head, instead of the temples 30a and 30b. That is, the glasses type virtual reality device 1 according to one or more embodiments is not limited to that shown in FIG. 24, and may be applied in various forms to various electronic devices.

Further, as illustrated in FIG. 25, the micro display substrates 101 illustrated in the embodiment of the present disclosure may be applied as a position display device 10_2 of a watch-type smart device 2 that is one of the smart devices.

Figure 26:
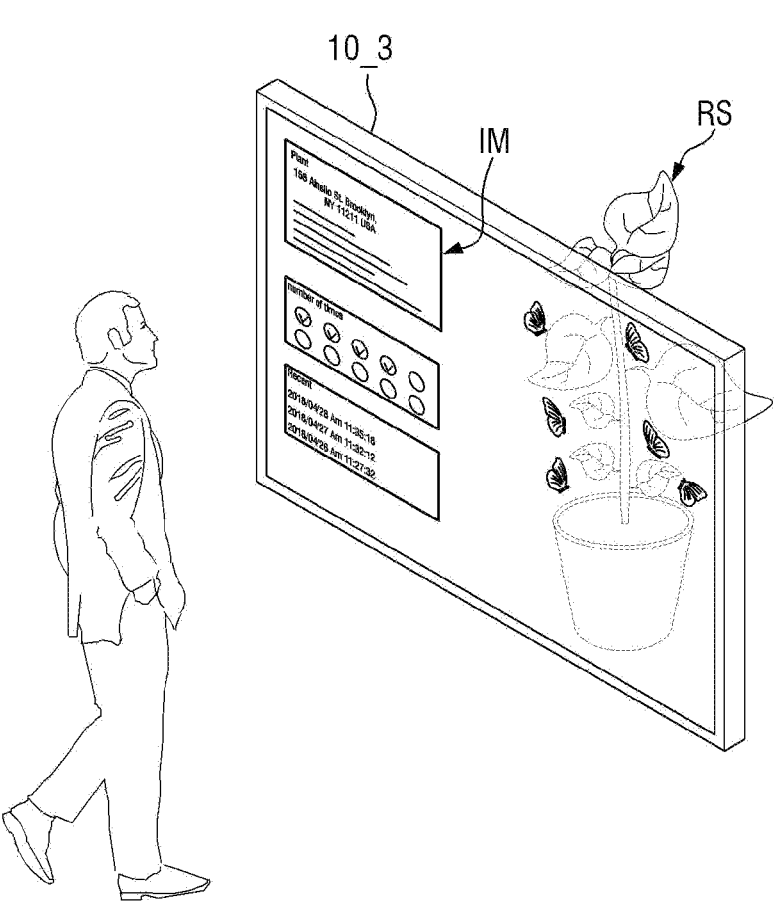
FIG. 26 is a diagram illustrating a transparent display device including a display device according to one or more embodiments.

FIG. 26 is a diagram illustrating a transparent display device including a display device according to one or more embodiments.

Referring to FIG. 26, the main micro display substrates 101 illustrated in the embodiment of the present disclosure may be applied to a transparent display device. The transparent display device may display an image IM, and also may transmit light. Thus, a user located on the front side of the transparent display device can view an object RS or a background on the rear side of the transparent display device as well as the image IM displayed on the micro display panel. When the micro display substrate 101 is applied to the transparent display device, the micro display substrate 101 shown in FIG. 26 may include a light transmitting portion capable of transmitting light or may be made of a material capable of transmitting light.

In concluding the detailed description, those skilled in the art will appreciate that many variations and modifications can be made to the embodiments without substantially departing from the principles and scope of the present disclosure Therefore, the embodiments of the present disclosure are used in a generic and descriptive sense only and not for purposes of limitation.

What is claimed is:

1. An apparatus for fabricating a display panel the apparatus comprising:

a loading module configured to accommodate a fabricating substrate, the loading module being configured to adjust an inclination of the fabricating substrate from a rear surface of the fabricating substrate and to press the fabricating substrate; and an element transfer module configured to transfer a plurality of light emitting elements or an integrated circuit onto the fabricating substrate and configured to bond and press a wafer on which the plurality of light emitting elements or the integrated circuit is located onto the fabricating substrate, wherein the element transfer module comprises:

a transfer member comprising a pressing header fixed to a fixing part of the transfer member in a pressing direction;

a transfer driving member configured to move the transfer member and the pressing header in the pressing direction or a detaching direction through a fixing frame of the transfer member;

a pressure sensing module between the pressing header and the transfer member and configured to generate pressure detection signals according to a pressure applied to the pressing header; and a first module configured to calculate pressing force control values for controlling a bonding pressing force of the loading module based on magnitudes of the pressure detection signals.

2. The apparatus of claim 1, wherein the pressure sensing module is:

configured to detect a magnitude of pressure applied to the pressing header by using a plurality of pressure sensors located at positions facing different directions;

configured to generate the pressure detection signals based on the magnitude of the pressure; and configured to transmit the pressure detection signals to the first module together with respective position codes for the plurality of pressure sensors using a signal transmission circuit.

3. The apparatus of claim 2, wherein the first module is configured to:

detect a magnitude deviation of the pressure detection signals;

calculate the pressing force control values of the loading module to zero the magnitude deviation of the pressure detection signals; and transmit the position codes for the plurality of pressure sensors and the pressing force control values to the loading module.

4. The apparatus of claim 2, wherein the plurality of pressure sensors are respectively:

located at corner positions of an inner stepped portion according to a shape of the inner stepped portion and an insertion hole of the transfer member to which the pressing header is fixed; or located in four axial directions of an inner stepped portion formed in a quadrangular shape, respectively; or arranged in at least one polygonal shape of a triangle, a pentagon, or a hexagon.

5. The apparatus of claim 1, wherein the loading module comprises:

a flat plate divided into a plurality of block areas and having a plurality of air holes in each of the plurality of block areas;

an air supply stage having a plurality of air supply areas respectively corresponding to the plurality of block areas and configured to supply air to the plurality of air holes in at least one of the plurality of block areas;

an elastic film layer covering a front surface of the flat plate or a loading surface for loading the fabricating substrate; and a support frame having a sidewall frame having a first opening corresponding to a loading surface of the flat plate and surrounding an outer surface of the loading surface from a side surface.

6. The apparatus of claim 5, wherein the plurality of block areas correspond to arrangement positions or arrangement areas of pressure sensors in the pressure sensing module of the element transfer module, respectively.

7. The apparatus of claim 5, wherein the plurality of block areas correspond to arrangement positions or arrangement areas of pressure controllers in the transfer driving member of the element transfer module, respectively.

8. The apparatus of claim 5, wherein the air supply stage comprises a plurality of air injectors configured to generate air based on the pressing force control values and respective position codes for a plurality of pressure sensors inputted from the first module of the element transfer module, and wherein the plurality of air injectors are respectively located in the plurality of air supply areas.

9. The apparatus of claim 8, wherein the plurality of air injectors are matched with arrangement positions and position codes of the plurality of pressure sensors located in the element transfer module, respectively, to generate and inject air based on the pressing force control values for each matched position code.

10. The apparatus of claim 9, wherein an air injection intensity and an injection period of each of the plurality of air injectors are set based on magnitudes of the pressing force control values.

11. The apparatus of claim 9, wherein the first module is configured to detect a magnitude deviation of the pressure detection signals detected through the plurality of pressure sensors and to calculate the pressing force control values of the loading module to zero the magnitude deviation of the pressure detection signals, and wherein the plurality of air injectors selectively inject air to each of the plurality of air supply areas based on the pressing force control values for each of the position codes matched with the plurality of pressure sensors.

12. The apparatus of claim 5, wherein the elastic film layer comprises an elastic material selected from a group of silicon, natural rubber, and/or synthetic rubber, or the elastic film layer comprises a diaphragm comprising the elastic material.

13. The apparatus of claim 5, wherein an outermost surface of the elastic film layer is attached to an outermost surface of the flat plate along a front outermost surface of the flat plate to seal the front surface of the flat plate.

14. The apparatus of claim 5, wherein an outermost surface of the elastic film layer is attached to an outermost surface of the loading surface along the loading surface of the flat plate to seal the loading surface on which the fabricating substrate is loaded.

15. The apparatus of claim 5, wherein the support frame is in front of the elastic film layer along an outermost surface of the elastic film layer to press the outermost surface of the elastic film layer and supports side surfaces of the wafer and the fabricating substrate located on a front surface of the elastic film layer corresponding to the loading surface.

* * * * *